US007190608B2

(12) United States Patent
Williford et al.

(10) Patent No.: US 7,190,608 B2
(45) Date of Patent: Mar. 13, 2007

(54) SENSING OF RESISTANCE VARIABLE MEMORY DEVICES

(75) Inventors: Ethan Williford, Boise, ID (US); Mark Ingram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/473,308

(22) Filed: Jun. 23, 2006

(65) Prior Publication Data

US 2006/0285381 A1    Dec. 21, 2006

Related U.S. Application Data

(63) Continuation of application No. 10/931,129, filed on Sep. 1, 2004.

(51) Int. Cl.
*G11C 11/00* (2006.01)

(52) U.S. Cl. ........................................ 365/148; 365/188

(58) Field of Classification Search ............. 365/148, 365/188, 156, 190
See application file for complete search history.

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |

(Continued)

FOREIGN PATENT DOCUMENTS

JP    56126916    10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Vu A. Le
(74) *Attorney, Agent, or Firm*—Dickstein Shapiro LLP

(57) ABSTRACT

A resistance variable memory device such as e.g., a PCRAM memory device, with either a 4T (transistor) or 2T memory cell configuration and either a dual cell plate or word line configuration. The device includes additional circuitry configured to write or erase addressed cells while keeping the voltage across non-addressed cells at approximately 0V. The device also includes circuitry that reads the addressed cells in a manner that increases the sensing window without causing the potential across the cell to be greater than approximately 200 mV. The device may also sense the state of its addressed cells closer in time to when the cells are accessed, in comparison to typical sensing techniques.

26 Claims, 16 Drawing Sheets

U.S. PATENT DOCUMENTS

| | | |
|---|---|---|
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Chiang |
| 6,555,860 B2 | 4/2003 | Lowrey et al. |
| 6,563,164 B2 | 5/2003 | Lowrey et al. |
| 6,566,700 B2 | 5/2003 | Xu |
| 6,567,293 B1 | 5/2003 | Lowrey et al. |
| 6,569,705 B2 | 5/2003 | Chiang et al. |
| 6,570,784 B2 | 5/2003 | Lowrey |
| 6,576,921 B2 | 6/2003 | Lowrey |
| 6,586,761 B2 | 7/2003 | Lowrey |
| 6,589,714 B2 | 7/2003 | Maimon et al. |
| 6,590,807 B2 | 7/2003 | Lowrey |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowrey et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowrey et al. |
| 6,671,710 B2 | 12/2003 | Ovshinsky et al. |
| 6,673,648 B2 | 1/2004 | Lowrey |
| 6,673,700 B2 | 1/2004 | Dennison et al. |

| | | |
|---|---|---|
| 6,674,115 B2 | 1/2004 | Hudgens et al. |
| 6,687,153 B2 | 2/2004 | Lowrey |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,731,528 B2 | 5/2004 | Hush et al. |
| 6,888,745 B2 * | 5/2005 | Ehiro et al. .......... 365/158 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0169625 A1 | 9/2003 | Hush et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2004/0071042 A1 | 4/2004 | Moore et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions amorphous solids, Annu. Rev. Phys. Chem. 43 (1992) 693-717.

Aniya, M., Average electronegativity, medium-range order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechansim in ionic glasses, J. Chem. Phys. 111 (1999) 7546-7557.

Belin, R.; Taillades, G.; Pradel, A.; Ribes, M., Ion dynamics in superionic chalcogenide glasses; complete conductivity spectra, Solid state Ionics 136-137 (2000) 1025-1029.

Belin, R.; Zerouale, A.; Pradel A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bemede, J.C.; Khelil, A.; Ketlaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing. Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x-glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Int. Conf. Phys. Semicond. (Eds. Chadi and Harrison) 17$^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chemyak, L.; Gartsman, K.; Jakubowicz, A., Room-Temperature, electric field induced creation of stable devices in CuInSe2 Crystals, Science 258 (1992) 271-274

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GeSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.: and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Dearnaley, G.; Stoneham, A.M.: Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bemede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliot, S.R., A unified mechanism for metal photodissolution in amorphous chalcogenide materials, J. Non-Cryst. Solids 130 (1991) 85-97.

Elliot, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X.;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G., Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia. Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T., Suzuki, M.; Okano, S., Nonvolatile memory based on reversible phase transition phenomena in telluride glasses, Jap. J. Appl. Phys. 28 (1989).

Guin, J.-P; Rouxel, T.; Keryvin, V.; Sangleboeuf, J.-C; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P; Rouxel, T.; Sangleboeuf, J.-C; Melscoat, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M., Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room termperature quantized resistance effects in metal-a-Si:H-metal thin films structures, J. Non-Cryst. Solids 198-200 (1996) 825-828.

Hajto, J.; Owen, A.E.; Snell, A.J.; Le Comber, P.G.; Rose, M.J., Analogue memory and ballitic electron in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M., Sedeek, K., Memory switching phenomena in thin films of chalcogenide semiconductors, Vacuum 45 (1994) 459-462.

Helbert et al., *Intralevel hybrid resist process with submicron capability*, SPIE vil. 333 Submicron Lithography, pp. 24-29 (1982).

Hilt, Dissertation: *Materials characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2 S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non.Cryst. Solids 262 (2000) 135-142.

Jones,G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. stat. Sol. (a) 13 (1972) K105-K109.

Joullie, A.M.; Marucchi, J., Electrical properties of the amorphous As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3-Ag2S, GeS2-GeS-Ag2S and P2S5-Ag2S Glasses, J. Non-Cryst Solids 20(1976) 393-404.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschef, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 1994 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozickl et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozclckl et al., Applications of Programmable Resistance Changes in Metal-Doped Chalcogenides, Electrochemical Society Proceedings, vol. 99-13, 1999, pp. 298-309.

Kozickl et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung. N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2-V205 based glasses, Journal de Physique IV 2 (1992) C2-185—C2-188.

McHardy et al., The dissolution of metals in amorphous chalcogenides and th effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitova, M.; Boolchand, P., Microscopic origin of the glass forming tendency in chalcogenides and constraint theory, J. Non-Cryst. Solids 240 (1998) 1-21.

Mitkova, M.; Kozlcki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role as Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y, Electrical properties of Ag2Se, J. Phys. Soc. Japan 13 (1958) 317.

Miyatani, S.-y, Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logicm Mettalurgical transactions 2 (1971) 641-645.

Ovshinsky, S.R., Reversible electrical switching phenomena in disordered structures, Phys.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J; Snell, A.J., Switching in amorphous devices, Int. J. Electronics 73 (1992) 897-906..

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1997) 221-223.

Popescu, C., The effect of local non-uniformitites on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.K.H.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.: Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose, M.J.:Hajto,J.;Lecomber,P.G.:Gage,S.M.;Choi,W.K.;Snell,A.J;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vaccum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/ metal thin films structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-KL122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K., Iizima, S.; Sugi, M.; Okada, Y.; Kikuchi, M., Thermal effects on switching phenomenon in chalcogenide amorphous semiconductors, Solid Stat Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal (??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se.06, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non.-Cryst. Solids 2 (1970) 358-370.

Viger, C.; Lefrancois, G.; Fleury, G., Anmalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductords, App. Phys. Lett. 16 (1970) 72-73.

West, W.C.; Sieradzki, K.; Kardynal, B.; Kozlcki, M.N., Equivalent circuit modeling of the AgAs0.24S0.36Ag0.40 Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Pulok Pattanayak et al., "Signature of a silver phase percolation threshold in microscopically phase separated ternary $Ge_{0.15}Se_{0.85-x}Ag_x$ ($0 \ÿ x \ÿ 0.20$) glasses," Journal of Applied Physics 97, 013515 (2005).

* cited by examiner

SENSING OF RESISTANCE VARIABLE MEMORY DEVICES

This application is a continuation of application No. 10/931,129 filed on Sep. 1, 2004, which is hereby incorporated by reference in its entirety.

FIELD OF THE INVENTION

The invention relates generally to the field of random access memory (RAM) devices and more particularly to the improved sensing of RAM devices formed using a resistance variable material.

BACKGROUND

Resistance variable memory elements, which include Programmable Conductive Random Access Memory (PCRAM) elements, have been investigated for suitability as semi-volatile and non-volatile random access memory devices. In a typical PCRAM device, the conductivity/resistance of a chalcogenide glass backbone can be programmed to stable lower conductivity (i.e., higher resistance) and higher conductivity (i.e., lower resistance) states. An unprogrammed PCRAM device is normally in a lower conductivity, higher resistance state.

A conditioning operation forms a conducting channel of a metal-chalcogenide in the PCRAM device, which supports a conductive pathway for altering the conductivity/resistivity state of the device. After the conditioning operation, a write operation will program the PCRAM device to a higher conductivity state, in which metal ions accumulate along the conducting channel(s). The PCRAM device may be read by applying a voltage of a lesser magnitude than required to program it; the current or resistance across the memory device is sensed as higher or lower to define the logic "one" and "zero" states. The PCRAM may be erased by applying a reverse voltage (opposite bias) relative to the write voltage, which disrupts the conductive pathway, but typically leaves the conducting channel intact. In this way, such a device can function as a variable resistance memory having at least two conductivity states, which can define two respective logic states, i.e., at least a bit of data.

FIG. 1 illustrates a portion of a memory device 10 utilizing resistance variable memory elements as memory cells $12_0$, $12_1$. For exemplary purposes, PCRAM elements are used as the cells $12_0$, $12_1$. Each memory cell $12_0$, $12_1$ has a cell plate connected to a cell plate potential CPIN and is connected to a respective access transistor $14_0$, $14_1$. The first access transistor $14_0$ is connected between the first memory cell $12_0$ and a first digit line DIGIT. The second access transistor $14_1$ is connected between the second memory cell $12_1$ and a second digit line $\overline{\text{DIGIT}}$. The gates of the access transistors $14_0$, $14_1$ are connected to word lines $WL_0$, $WL_1$ such that they receive row select signals R0, R1, respectively.

The device 10 also includes sensing circuitry 30 connected to the digit lines DIGIT, $\overline{\text{DIGIT}}$. The sensing circuitry 30 includes an equilibration circuit 32, two column select transistors 42, 44, a reference voltage circuit 50, two isolating transistors 62, 64, a p-sense amplifier driver 78, a p-sense amplifier circuit 70, an n-sense amplifier driver 88 and an n-sense amplifier circuit 80.

The equilibration (EQ) circuit 32 includes three EQ transistors 34, 36, 38. The first EQ transistor 34 is connected between the two digit lines DIGIT, $\overline{\text{DIGIT}}$. The second EQ transistor 36 is connected between the first digit line DIGIT and the third EQ transistor 38. The third EQ transistor 38 is connected between the second digit line $\overline{\text{DIGIT}}$ and the second EQ transistor 36. The gate terminals of the three EQ transistors 34, 36, 38 are connected to an equilibration gating line EQ. A bias voltage DVC2 is applied at the connection of the second and third EQ transistors 36, 38. All three of the EQ transistors 34, 36, 38 are NMOS transistors. The equilibration circuit 32, in response to the equilibration gating signal EQ, effectively equalizes the charges held by the digit lines DIGIT, $\overline{\text{DIGIT}}$ after a read/write operation is completed and when the memory array is not active.

The first column select transistor 42 has its source and drain terminals connected between the first digit line DIGIT. The second column select transistor 44 has its source and drain terminals connected between the second digit line $\overline{\text{DIGIT}}$. The gates of the column select transistors 42, 44 are connected to respective column select lines to receive a column select signal CSEL. The column select transistors 42, 44 are activated by the column select signal CSEL when it is desired to connect the remaining circuitry of the sensing circuitry 30 to the memory cells $12_0$, $12_1$ (such as for example when it is time to write, erase or read the cells $12_0$, $12_1$).

The reference voltage circuit 50 includes 4 reference voltage transistors 52, 54, 56, 58. The first reference voltage transistor 52 is connected between the first digit line DIGIT and the second reference voltage transistor 54. The second reference voltage transistor 54 is connected between the first reference voltage transistor 52 and the second digit line $\overline{\text{DIGIT}}$. DVC2 is applied to the connection between the first and second reference voltage transistors 52, 54. The third reference voltage transistor 56 is connected between the first digit line DIGIT and the fourth reference voltage transistor 58. The fourth reference voltage transistor 58 is connected between the third reference voltage transistor 56 and the second digit line $\overline{\text{DIGIT}}$. A reference voltage VREF is applied to the connection between the third and fourth reference voltage transistors 56, 58.

The gate of the first reference voltage transistor 52 is connected to the gate of the fourth reference voltage transistor 58 and to a first reference voltage signal REF E. The gate of the second reference voltage transistor 54 is connected to the gate of the third reference voltage transistor 56 and to a second reference voltage signal REF O. The operation of the reference voltage circuit 50 is explained below in more detail.

The first isolating transistor 62 is connected between the first digit line DIGIT and a first connection between the p-sense amplifier circuit 70 and the n-sense amplifier circuit 80. The second isolating transistor 64 is connected between the second digit line $\overline{\text{DIGIT}}$ and a second connection between the p-sense amplifier circuit 70 and the n-sense amplifier circuit 80. The gate terminals of the first and second isolating transistors 62, 64 are connected to an isolation gating signal SA ISO. The illustrated isolating transistors 62, 64 are NMOS transistors. The isolating transistors 62, 64, when activated by the isolation gating signal SA ISO, form isolation devices that effectively remove certain portions of the circuit 30 during addressing for a portion of a read and during a write and erase.

The p-sense amplifier circuit 70 includes two PMOS transistors 72, 74. The n-sense amplifier circuit 80 includes two NMOS transistors 82, 84. The first PMOS transistor 72 has its gate terminal connected to the second digit line $\overline{\text{DIGIT}}$ and is connected between the first NMOS transistor 82 and the p-sense amplifier driver 78. The second PMOS transistor 74 has its gate terminal connected to the first digit line DIGIT and is connected between the second NMOS transistor 84 and driver 78. The p-sense amplifier driver 78 drives the p-sense amplifier 70 when a p-sense amplifier latching signal PL is applied to the gate of the driver 78.

The first NMOS transistor 82 has its gate terminal connected to the second digit line $\overline{\text{DIGIT}}$ and is connected between the n-sense amplifier driver 88 and the first PMOS transistor 72. The second NMOS transistor 84 has its gate terminal connected to the first digit line DIGIT and is connected between driver 88 and the second PMOS transistor 74. The n-sense amplifier driver 88 drives the n-sense amplifier 80 when an n-sense amplifier latching signal NL is applied to the gate of the driver 88.

Two write/erase circuits $92_0$, $92_1$ are respectively connected to the digit lines DIGIT, $\overline{\text{DIGIT}}$ via the sensing circuitry 30. The write/erase circuits $92_0$, $92_1$ apply a first programming voltage VPNS to the digit lines DIGIT, $\overline{\text{DIGIT}}$ when the cells $12_0$ or $12_1$ are to be written to the high conductivity (i.e., lower resistance) state (as described above) depending on which row R1, R0 is accessed. The write/erase circuits $92_0$, $92_1$ apply a second programming voltage VPPS, typically a reverse voltage (i.e., opposite bias) relative to the first programming voltage VPNS, to the digit lines DIGIT, $\overline{\text{DIGIT}}$ when the cells $12_0$ or $12_1$ are to be written to the lower conductivity (i.e., higher resistance) state (as described above) depending on which row R1 or R0 is accessed. The appropriate column select transistors 42, 44 will also need to be activated during the write and erase operations.

To read the first memory cell $12_0$, for example, the first reference signal REF E is generated, which causes the reference voltage circuit 50 to precharge the first digit line DIGIT to DVC2 (via an activated first column select transistor 42). In addition, the reference voltage circuit 50 precharges the second digit line $\overline{\text{DIGIT}}$ to the reference voltage VREF. These precharged values will be applied to the digit lines and to the p-sense amplifier 70 and n-sense amplifier 80 (via activated isolation transistor 64). The current across the memory cell $12_0$ is sensed by p-sense amplifier 70 and n-sense amplifier 80 (via activated isolation transistor 62) and compared to the reference voltage VREF to determine the state of the memory cell $12_0$ once the access transistor $14_0$ is turned on.

Similarly, to read the second memory cell $12_1$, the second reference signal REF O is generated, which causes the reference voltage circuit 50 to apply DVC2 to the second digit line $\overline{\text{DIGIT}}$ (via an activated second column select transistor 44 and access transistor $14_1$). In addition, the reference voltage circuit 50 applies the reference voltage VREF to the first digit line, DIGIT. Again, these precharged values will be applied to the digit lines and to the p-sense amplifier 70 and n-sense amplifier 80 (via activated isolation transistor 62). The current across the memory cell $12_1$ is sensed by p-sense amplifier 70 and n-sense amplifier 80 (via activated isolation transistor 64) and compared to the reference voltage VREF to determine the state of the memory cell $12_1$ once the access transistor 141 is turned on.

Under the current architecture, PCRAM cells, such as e.g., cells $12_0$, $12_1$, can only sustain approximately a 200 mV potential across the cell before a partial erase or write occurs. Changes in the cell plate potential CPIN and the digit line programming voltages VPPS, VPNS allow an addressed cell to be written to or erased. The drawback, however, is that with different potentials for the cell plate and the equilibrated digit lines, non-addressed cells on the same word line may also become partially erased or written.

Typically, a written cell would cause its digit line voltage to approach CPIN, while an erased cell would cause its digit line voltage to approach DVC2. The p-sense amplifier 70 and n-sense amplifier 80 of the sensing circuitry 30 attempts to differentiate the digit line potential from the reference voltage VREF, which is applied to the complementary digit line. FIG. 2 illustrates a graph of sense time v. digit line voltage for the memory device 10 illustrated in FIG. 1. Line 102 represents the digit line voltage for a written cell. Line 104 represents the digit line voltage for an erased cell. If DVC2 is 1.0V (line 110) and CPIN is 1.2V (line 106), VREF is 1.1V (line 108). This leaves at most 100 mV of sensing differential at the time the sense amplifiers are latched (e.g., at approximately 150 nS). Most likely, there is approximately a 60 mV differential when the cell is written and about a 40 mV differential when the cell is erased.

There is a need and desire to increase the sensing window for a resistance variable memory device such as e.g., a PCRAM memory device. There is also a need and desire to increase the sensing window without causing the potential across the cell to be greater than approximately 200 mV.

There is also a need and desire to write to resistance variable memory cells while keeping the voltage across non-addressed cells at approximately 0V. There is also a need and desire to sense the state of resistance variable memory cells closer in time when the cells are accessed, in comparison to typical sensing techniques.

SUMMARY

The invention increases the sensing window for a resistance variable memory device such as e.g., a PCRAM memory device.

The invention also increases the sensing window without causing the potential across the cell to be greater than approximately 200 mV.

The invention also provides a technique for writing to resistance variable memory cells while keeping the voltage across non-addressed cells at approximately 0V.

The invention also provides a technique for sensing the state of resistance variable memory cells closer in time to when the cells are accessed (in comparison to typical sensing techniques).

The above and other features and advantages are achieved in various exemplary embodiments of the invention by providing a resistance variable memory device such as e.g., a PCRAM memory device, with either a 4T (transistor) or 2T memory cell configuration and either a dual cell plate or word line configuration. The device includes additional circuitry configured to write or erase addressed cells while keeping the voltage across non-addressed cells at approximately 0V. The device also includes circuitry that reads the addressed cells in a manner that increases the sensing window without causing the potential across the cell to be greater than approximately 200 mV. The device may also sense the state of its addressed cells closer in time to when the cells are accessed, in comparison to typical sensing techniques.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

Figure 1:
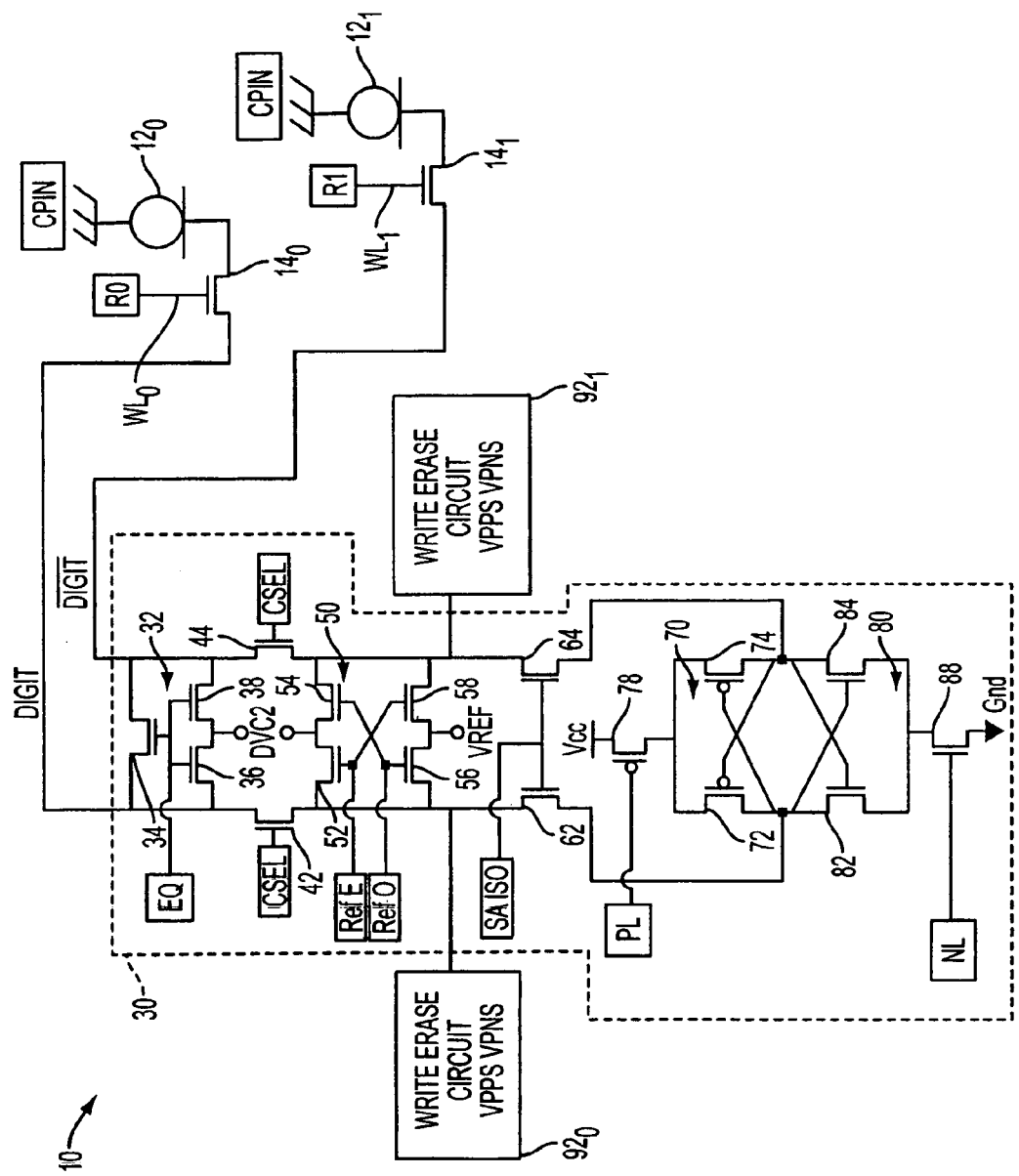
FIG. 1 illustrates a portion of a memory device utilizing resistance variable memory elements as memory cells.
Figure 2:
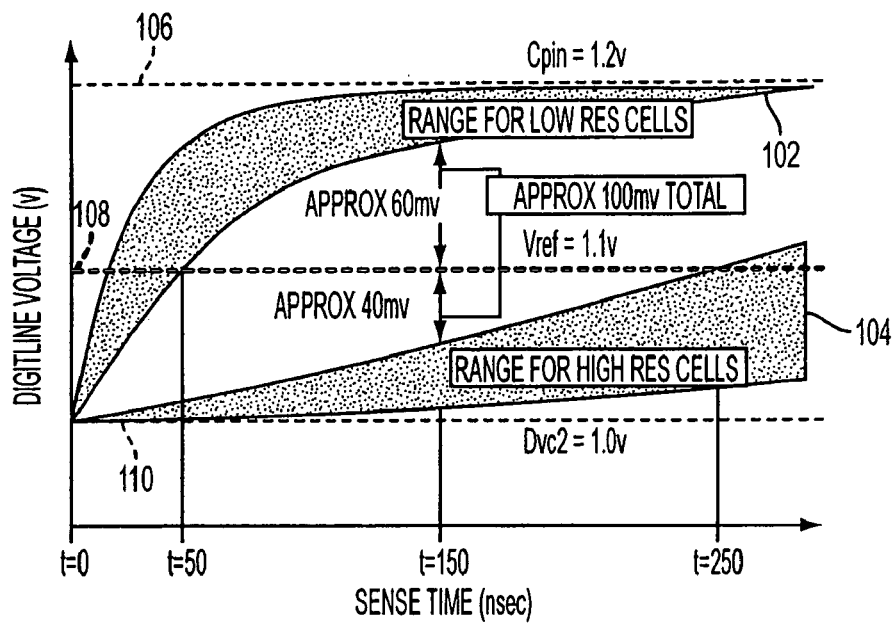
FIG. 2 illustrates a graph of sense time v. digit line voltage for the memory device illustrated in FIG. 1.
Figure 3:
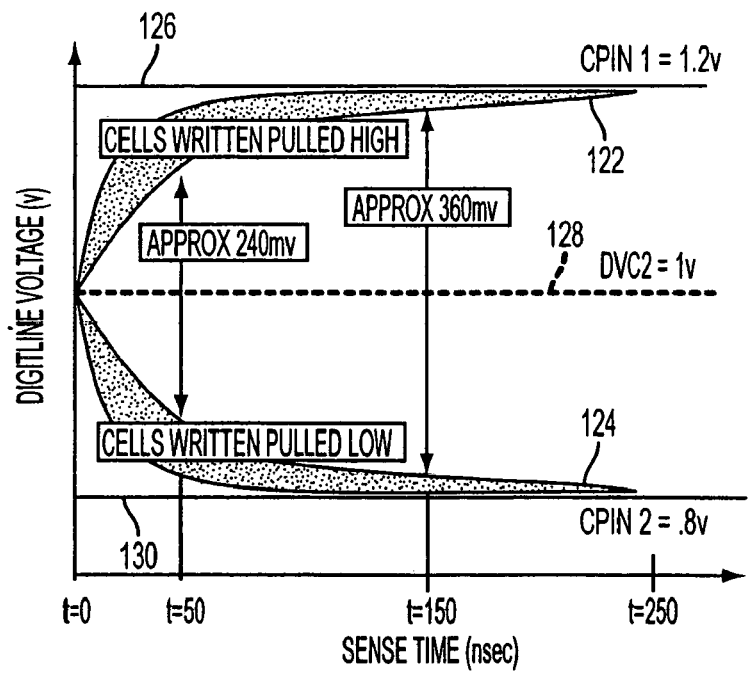
FIG. 3 illustrates a graph of sense time v. digit line voltage for a memory device constructed in accordance with the present invention.

The exemplary embodiments of the invention increase the sensing window for a resistance variable memory device such as e.g., a PCRAM memory device. This is illustrated in FIG. 3, which depicts a graph of sense time v. digit line voltage for a memory device constructed in accordance with the invention. Line 122 represents the digit line voltage for a written cell. Line 124 represents the digit line voltage for an erased cell. The graph illustrates two cell plate voltages CPIN1 (line 122) and CPIN2 (line 124). The cell plate voltages CPIN1, CPIN2 are discussed below in more detail. DVC2 is 1.0V (line 128), CPIN1 is 1.2V (line 122), and CPIN2 is 0.8V (line 130). This provides approximately 240 mV of sensing differential at a much earlier time (t=50 nS) in comparison to the memory device 10 illustrated in FIGS. 1 and 2. Thus, if the sense amplifiers were latched at this time (i.e., t=50 nS), there will be a larger sensing differential and the latching would occur 100 nS sooner than the memory device 10 of FIGS. 1 and 2. Moreover, there is an approximately 360 mV sensing differential at time t=150 nS, which is approximately 260 mV larger than the memory device 10 of FIGS. 1 and 2.

As is discussed below in more detail, the invention also increases the sensing window without causing the potential across the cell to be greater than approximately 200 mv. The invention also provides a technique for writing to resistance variable memory cells while keeping the voltage across non-addressed cells at approximately 0V.

Figure 4:
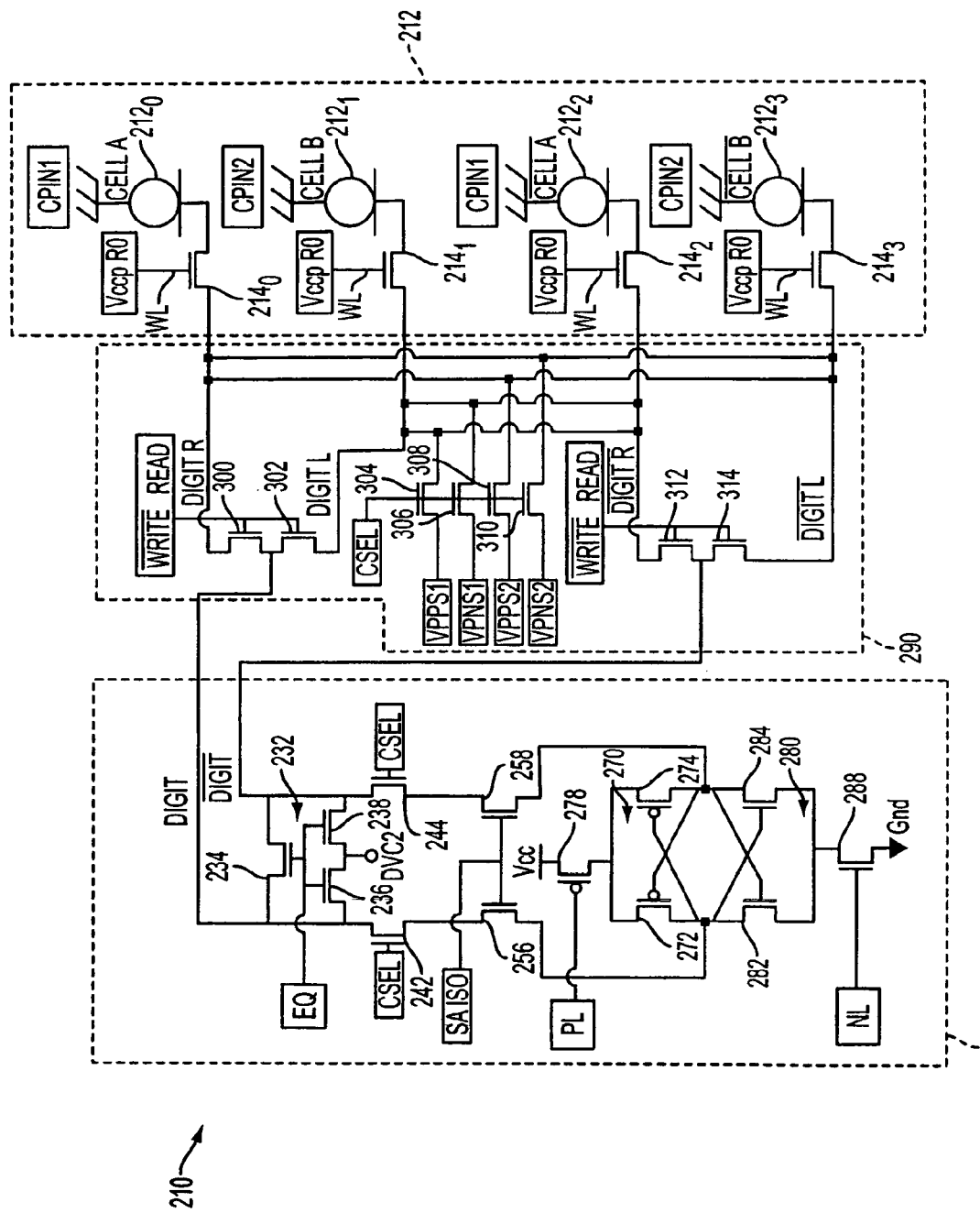
FIG. 4 illustrates a portion of a memory device, utilizing resistance variable memory elements as memory cells, constructed in accordance with an exemplary embodiment of the invention.

FIG. 4 illustrates a portion of a memory device 210, utilizing resistance variable memory elements as memory cells $212_0$, $212_1$, $212_2$, $212_3$, constructed in accordance with an exemplary embodiment of the invention. For exemplary purposes, PCRAM elements are used as the cells $212_0$, $212_1$, $212_2$, $212_3$. In the illustrated embodiment, the four memory cells $212_0$, $212_1$, $212_2$, $212_3$ are connected to the same word line WL via respective access transistors $214_0$, $214_1$, $214_2$, $214_3$. The first and third memory cells $212_0$, $212_2$ are connected to the first cell plate voltage CPIN1. The second and fourth memory cells $212_1$, $212_3$ are connected to the second cell plate voltage CPIN2.

The first access transistor $214_0$ is connected between the first memory cell $212_0$ (Cell A) and a right digit line DIGIT R. The second access transistor $214_1$ is connected between the second memory cell $212_1$ (Cell B) and a left digit line DIGIT L. The third access transistor $214_2$ is connected between the third memory cell $212_2$ ($\overline{\text{Cell A}}$) and a complementary right digit line $\overline{\text{DIGIT R}}$. The fourth access transistor $214_3$ is connected between the fourth memory cell $212_3$ ($\overline{\text{Cell B}}$) and a complementary left digit line $\overline{\text{DIGIT L}}$. The gates of the access transistors $214_0$, $214_1$, $214_2$, $214_3$ are connected to the same word line WL such that they receive a row select signal R0 at the same time. The memory cells $212_0$, $212_1$, $212_2$, $212_3$ and access transistors $214_0$, $214_1$, $214_2$, $214_3$ make up one large 4T PCRAM cell 212.

The device 210 also includes write/erase circuitry 290 connected between the digit lines DIGIT R, DIGIT L, $\overline{\text{DIGITR}}$, $\overline{\text{DIGITL}}$ and the first and second digit lines DIGIT, $\overline{\text{DIGIT}}$. The first and second digit lines DIGIT, $\overline{\text{DIGIT}}$ are complementary to each other and can be referred to as the digit line DIGIT and complementary digit line $\overline{\text{DIGIT}}$. The write/erase circuitry 290 also performs operations during a read operation and is discussed below in more detail.

The device 210 also includes sensing circuitry 230 connected to the first and second digit lines DIGIT, $\overline{\text{DIGIT}}$. The sensing circuitry 230 includes an equilibration circuit 232, two column select transistors 242, 244, two isolating transistors 256, 258, a p-sense amplifier driver 278, a p-sense amplifier circuit 270, an n-sense amplifier driver 288 and an n-sense amplifier circuit 280.

The equilibration (EQ) circuit 232 includes three EQ transistors 234, 236, 238. The first EQ transistor 234 is connected between the two digit lines DIGIT, $\overline{\text{DIGIT}}$. The second EQ transistor 236 is connected between the first digit line DIGIT and the third EQ transistor 238. The third EQ transistor 238 is connected between the second digit line $\overline{\text{DIGIT}}$ and the second EQ transistor 236. The gate terminals of the three EQ transistors 234, 236, 238 are connected to an equilibration gating line EQ. A bias voltage DVC2 is applied at the connection of the second and third EQ transistors 236, 238. All three of the EQ transistors 234, 236, 238 are NMOS transistors. The equilibration circuit 232, in response to the equilibration gating signal EQ, effectively equalizes the charges held by the digit lines DIGIT, $\overline{\text{DIGIT}}$ after a read/write operation is completed and when the memory array is not active.

The first column select transistor 242 has its source and drain terminals connected between the first digit line DIGIT. The second column select transistor 244 has its source and drain terminals connected between the second digit line $\overline{\text{DIGIT}}$. The gates of the column select transistors 242, 244 are connected to respective column select lines to receive a column select signal CSEL. The column select transistors 242, 244 are activated by the column select signal CSEL when it is desired to connect the remaining circuitry of the sensing circuitry 230 to the memory cells $212_0$, $212_1$, $212_2$, $212_3$ via circuit 290 and the access transistors $214_0$, $214_1$, $214_2$, $214_3$.

The first isolating transistor 256 is connected between the first digit line DIGIT and a first connection between the p-sense amplifier circuit 270 and the n-sense amplifier circuit 280. The second isolating transistor 258 is connected between the second digit line $\overline{\text{DIGIT}}$ and a second connection between the p-sense amplifier circuit 270 and the n-sense amplifier circuit 280. The gate terminals of the first and second isolating transistors 256, 258 are connected to an isolation gating signal SA ISO. The illustrated isolating transistors 256, 258 are NMOS transistors. The isolating transistors 256, 258, when activated by the isolation gating signal SA ISO, form isolation devices that effectively remove certain portions of the circuit 230 during addressing.

The p-sense amplifier circuit 270 includes two PMOS transistors 272, 274. The n-sense amplifier circuit 280 includes two NMOS transistors 282, 284. The first PMOS transistor 272 has its gate terminal connected to the second digit line $\overline{\text{DIGIT}}$ and is connected between the first NMOS transistor 282 and the p-sense amplifier driver 278. The second PMOS transistor 274 has its gate terminal connected to the first digit line DIGIT and is connected between the second NMOS transistor 284 and driver 278. The p-sense amplifier driver 278 drives the p-sense amplifier 270 when a p-sense amplifier latching signal PL is applied to the gate of the driver 278.

The first NMOS transistor 282 has its gate terminal connected to the second digit line $\overline{\text{DIGIT}}$ and is connected between the n-sense amplifier driver 288 and the first PMOS transistor 272. The second NMOS transistor 284 has its gate terminal connected to the first digit line DIGIT and is connected between driver 288 and the second PMOS transistor 274. The n-sense amplifier driver 288 drives the n-sense amplifier 280 when an n-sense amplifier latching signal NL is applied to the gate of the driver 288.

The write/erase circuit 290 contains four write/read transistors 300, 302, 312, 314 and four programming column select transistors 304, 306, 308, 310. The first write/read transistor 300 is connected between the second write/read transistor 302 and the right digit line DIGIT R. The second write/read transistor 302 is connected between the first write/read transistor 300 and the left digit line DIGIT L. The connection between the first and second write/read transistors 300, 302 is connected to the first digit line DIGIT. The gates of the first and second write/read transistors 300, 302 are connected to a write/read control signal $\overline{\text{WRITEREAD}}$.

The third write/read transistor 312 is connected between the fourth write/read transistor 314 and the complementary right digit line $\overline{\text{DIGITR}}$. The fourth write/read transistor 314 is connected between the second write/read transistor 312 and the complementary left digit line $\overline{\text{DIGITL}}$. The connection between the third and fourth write/read transistors 312, 314 is connected to the complementary digit line $\overline{\text{DIGIT}}$. The gates of the third and fourth write/read transistors 312, 314 are connected to the write/read control signal $\overline{\text{WRITEREAD}}$.

The first programming column select transistor 304 is connected between a first positive programming voltage VPPS1 and a connection between the left digit line DIGIT L and the complementary right digit line $\overline{\text{DIGITR}}$. The second programming column select transistor 306 is connected between a first negative programming voltage VPNS1 and a connection between the left digit line DIGIT L and the complementary right digit line $\overline{\text{DIGITR}}$. The third programming column select transistor 308 is connected between a second positive programming voltage VPPS2 and a connection between the right digit line DIGIT R and the complementary left digit line $\overline{\text{DIGITL}}$. The fourth programming column select transistor 310 is connected between a second negative programming voltage VPNS2 and a connection between the right digit line DIGIT R and the complementary left digit line $\overline{\text{DIGITL}}$. The programming column select transistors 304, 306, 308, 310 are activated when it is time to write or erase the memory cells $212_0$, $212_1$, $212_2$, $212_3$.

Figures 5, 10:
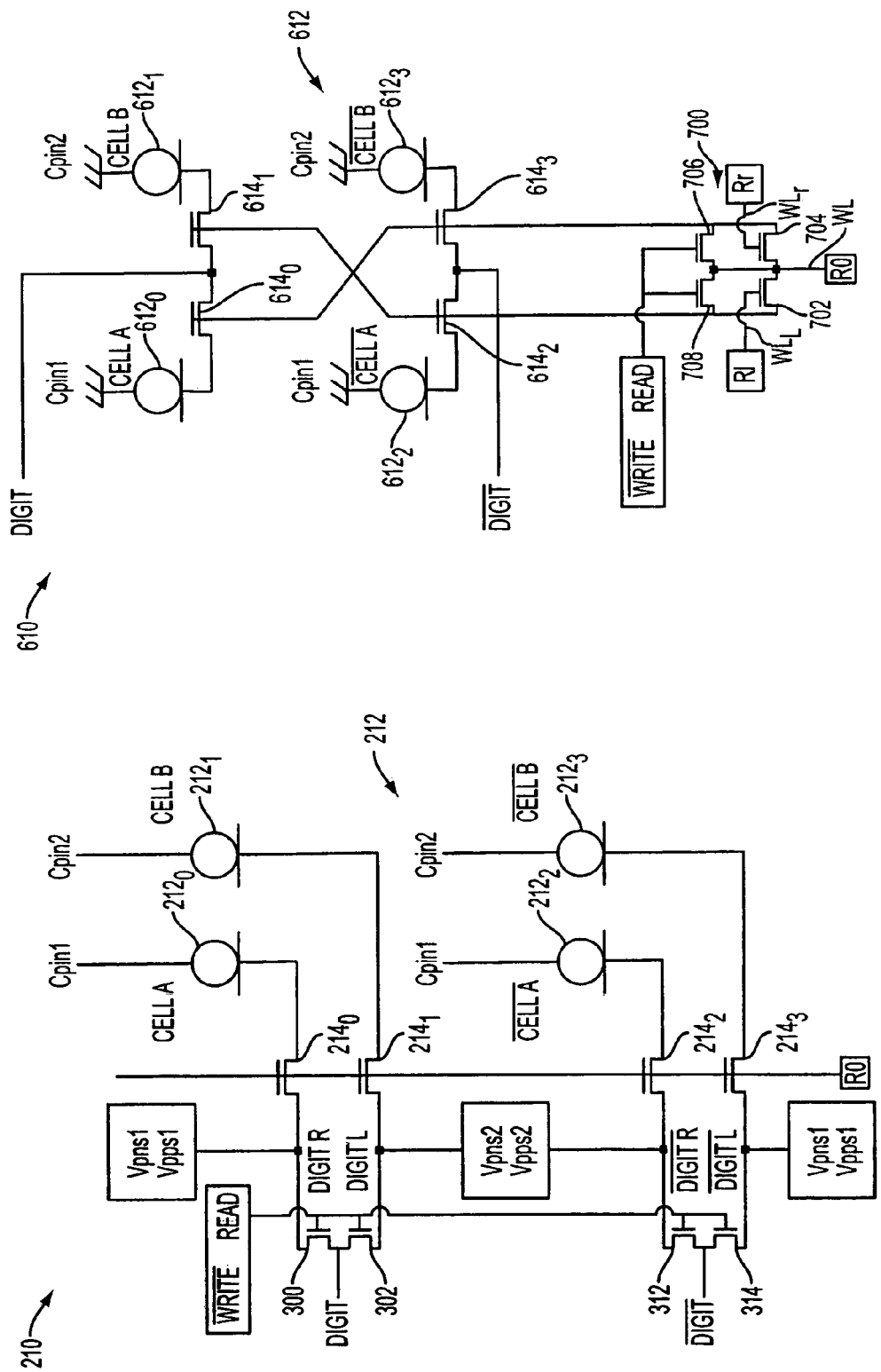
FIG. 5 illustrates a portion of the memory device illustrated in FIG. 4.
FIG. 10 illustrates a portion of the memory device illustrated in FIG. 9.

The operation of the memory device 210 is now described with reference to FIGS. 5 and 6A–6C. FIG. 5 illustrates a portion of the memory device 210 in a more simplified manner. The FIG. 5 illustration does not include the programming column select transistors 304, 306, 308, 310 since it is presumed that they have been activated by the column select signal CSEL.

Generally, to write or erase the memory cells $212_0$, $212_1$, $212_2$, $212_3$, the cell plate voltages CPIN1, CPIN2 are held at DVC2. The write/read control signal $\overline{\text{WRITEREAD}}$ allows the right digit line DIGIT R and complementary left digit line $\overline{\text{DIGITL}}$ or the left digit line DIGIT L and the complementary right digit line $\overline{\text{DIGITR}}$ to be accessed and programmed by the programming voltages VPPS1, VPPS2, VPNS1, VPNS2. All other non-accessed memory cells $212_0$, $212_1$, $212_2$, $212_3$ associated with the accessed word line WL ate not programmed since their top cell plate potential and their respective digit lines are held at DVC2. That is, the voltage across the non-addressed cells is approximately 0V.

Generally, during a read operation, the first cell plate voltage CPIN1 is set to DVC2+200 mV and the second cell plate voltage is set to DVC2−200 mV. When the write/read control signal $\overline{\text{WRITEREAD}}$ allows the right and left digit lines DIGIT R, DIGIT L to be connected to the sensing circuitry 230, the accessed memory cell either pulls its digit line up to the first programming voltage CPIN1 or down to the second programmed voltage CPIN2. The complementary digit line is programmed to be pulled to the opposite cell plate potential. As shown in FIG. 3, this creates an approximately 380 mV sensing differential at time t=150 nS.

Figure 6A:
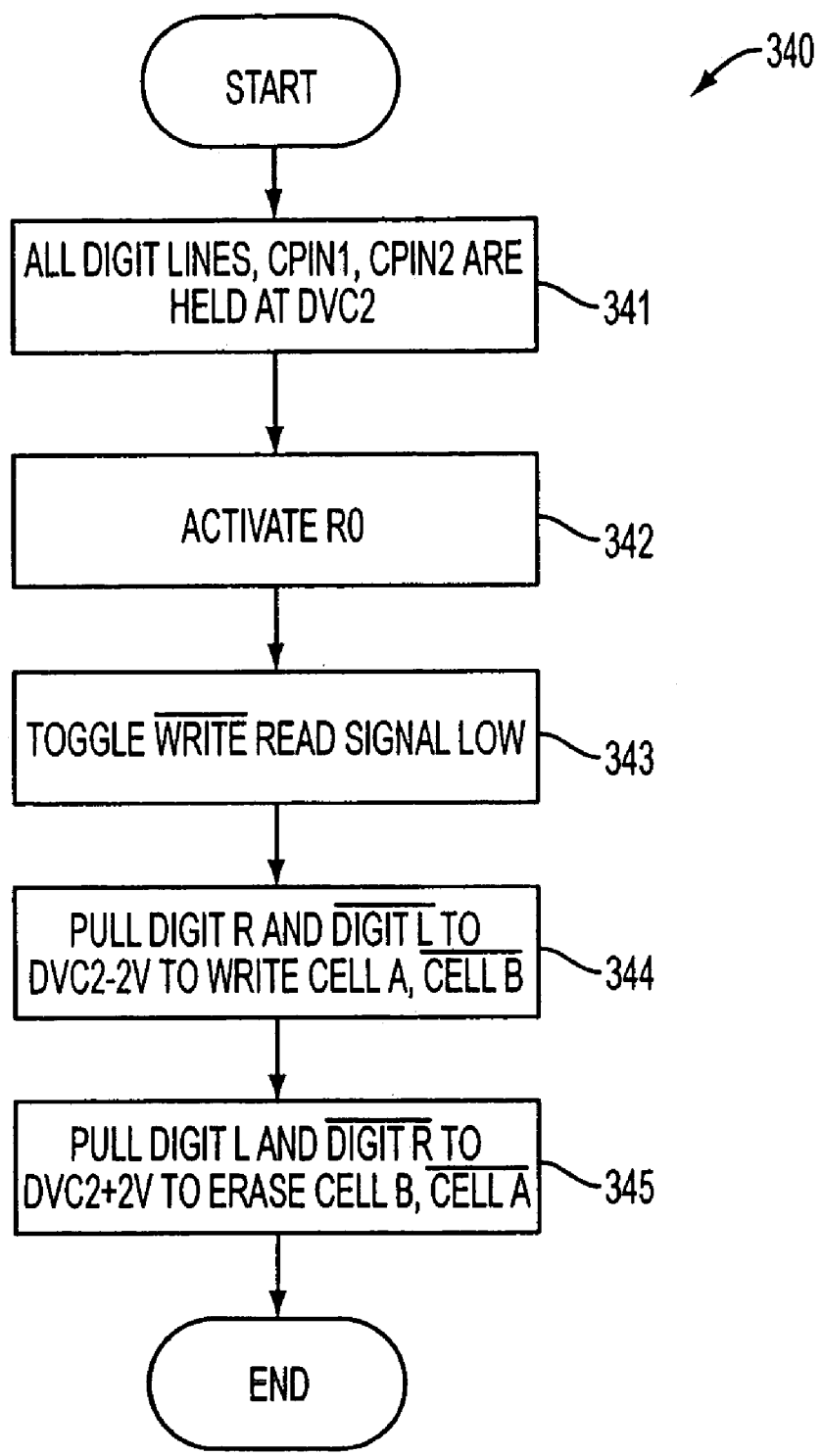
FIGS. 6A, 6B and 6C are flowcharts illustrating exemplary methods of operating the device illustrated in FIGS. 4 and 5.

Referring to FIGS. 5 and 6A, an exemplary method 340 of operating the memory device 210 is now described. In the illustrated method 340, cell $212_0$ (Cell A) and cell $212_3$ ($\overline{\text{CellB}}$) are written by writing the first digit line DIGIT to a high state. Initially, all digit lines DIGIT R, DIGIT L, $\overline{\text{DIGITR}}$, $\overline{\text{DIGITL}}$ and cell plate potentials (e.g., CPIN1, CPIN2) are held at DVC2 (step 341). The access transistors $214_0$, $214_1$, $214_2$, $214_3$ are activated by applying the row select signal R0 (step 342). The write/read control signal $\overline{\text{WRITEREAD}}$ is toggled low (step 343). The right digit line DIGIT R and the complementary left digit line $\overline{\text{DIGITL}}$ are pulled to DVC2−2V to write cell $212_0$ (Cell A) and cell $212_3$ ($\overline{\text{CellB}}$) at step 344. The left digit line DIGIT L and the complementary right digit line $\overline{\text{DIGITR}}$ are pulled to DVC2+2V to erase cell $212_1$ (Cell B) and cell $212_2$ ($\overline{\text{CellA}}$) at step 345. This places the cell 212 in a high resistance state.

Figure 6B:
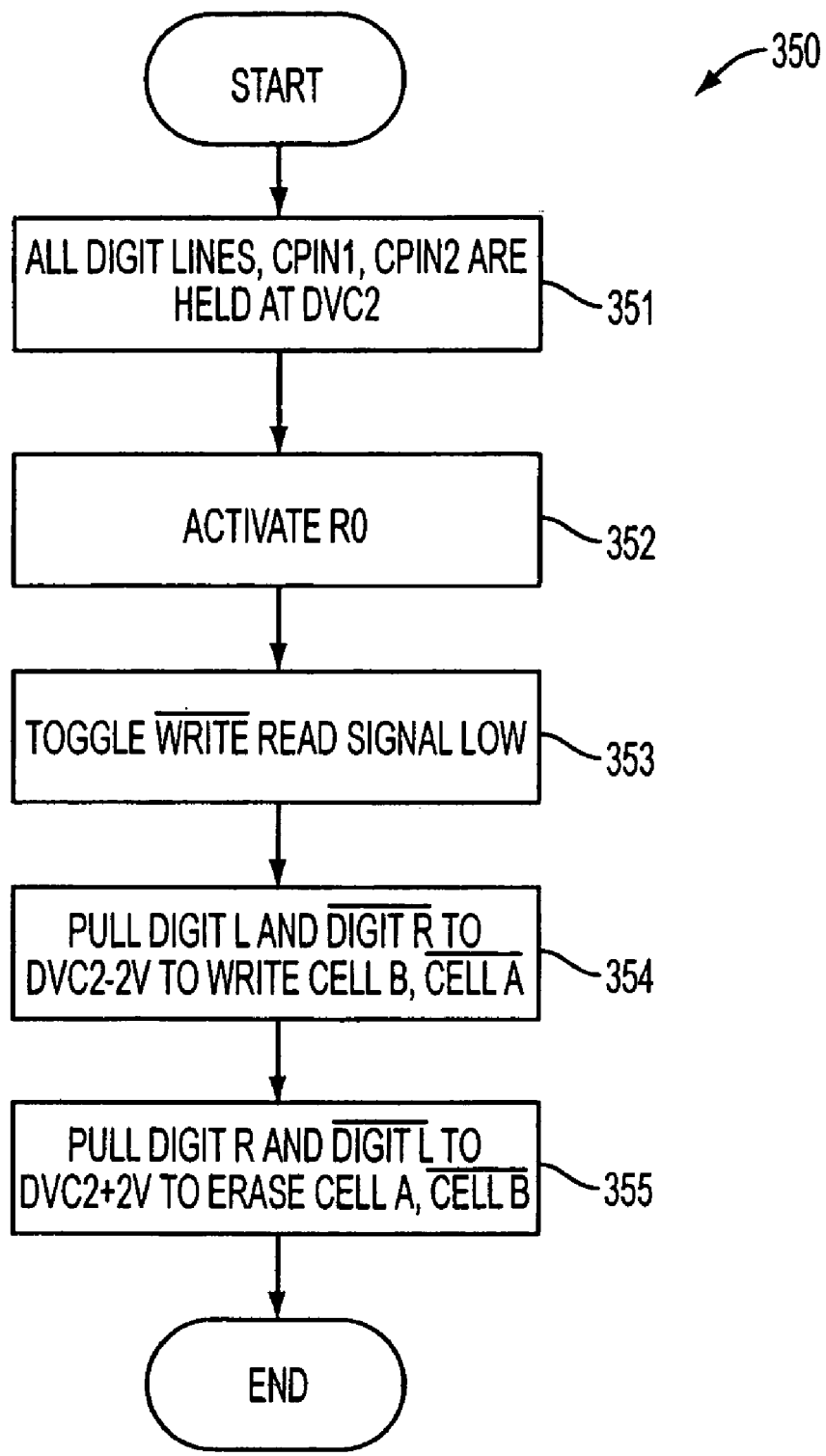

Referring to FIGS. 5 and 6B, another exemplary method 350 of operating the memory device 210 is now described. In the illustrated method 350, cell $212_1$ (Cell B) and cell $212_2$ ($\overline{\text{CellA}}$) are written by writing the second digit line $\overline{\text{DIGIT}}$ to a high state. Initially, all digit lines DIGIT R, DIGIT L, $\overline{\text{DIGITR}}$, $\overline{\text{DIGITL}}$ and cell plate potentials (e.g., CPIN1, CPIN2) are held at DVC2 (step 351). The access transistors $214_0$, $214_1$, $214_2$, $214_3$ are activated by applying the row select signal R0 (step 352). The write/read control signal $\overline{\text{WRITEREAD}}$ is toggled low (step 353). The left digit line DIGIT L and the complementary right digit line $\overline{\text{DIGITR}}$ are pulled to DVC2−2V to write cell $212_1$ (Cell B) and cell $212_2$ $\overline{\text{CellA}}$ at step 354. The right digit line DIGIT R and the complementary left digit line $\overline{\text{DIGITL}}$ are pulled to DVC2+2V to erase cell $212_0$ (Cell A) and cell $212_3$ ($\overline{\text{CellB}}$) at step 355. This places the cell 212 in a low resistance state.

Figure 6C:
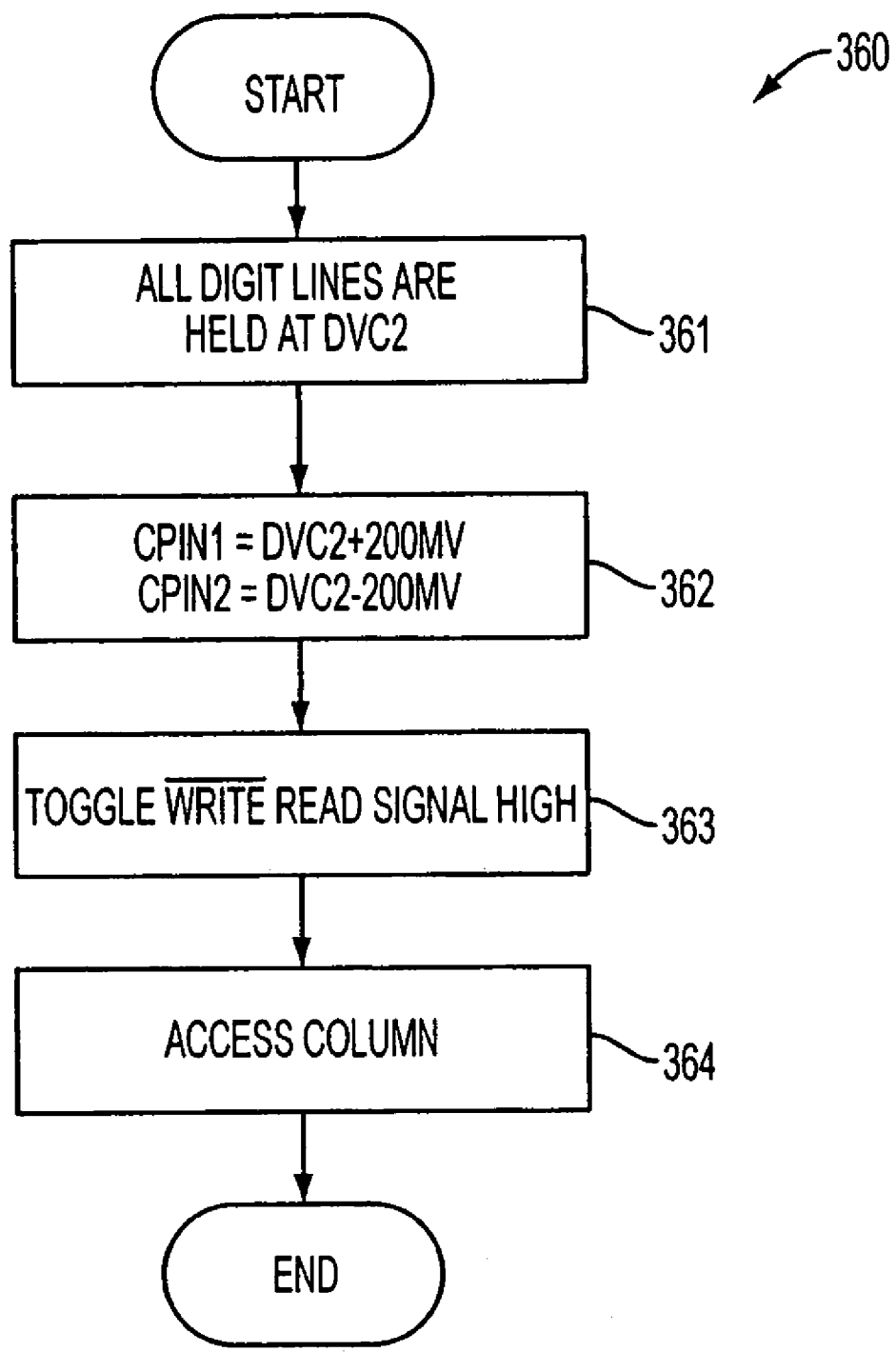

Referring to FIGS. 5 and 6C, an exemplary method 360 of operating the memory device 210 is now described for a read operation. Initially, all digit lines DIGIT R, DIGIT L, $\overline{\text{DIGITR}}$, $\overline{\text{DIGITL}}$ are held at DVC2 (step 361). Next, the first cell plate voltage CPIN1 is set to DVC2+200 mV while the second cell plate voltage CPIN2 is set to DVC2−200 mV (step 362). The write/read control signal $\overline{\text{WRITE}}$READ is toggled high (step 363) and the column can be accessed and sensed (step 364). As noted above, there will be a much larger sensing window as compared to the memory device 10 illustrated in FIGS. 1 and 2.

Figure 7:
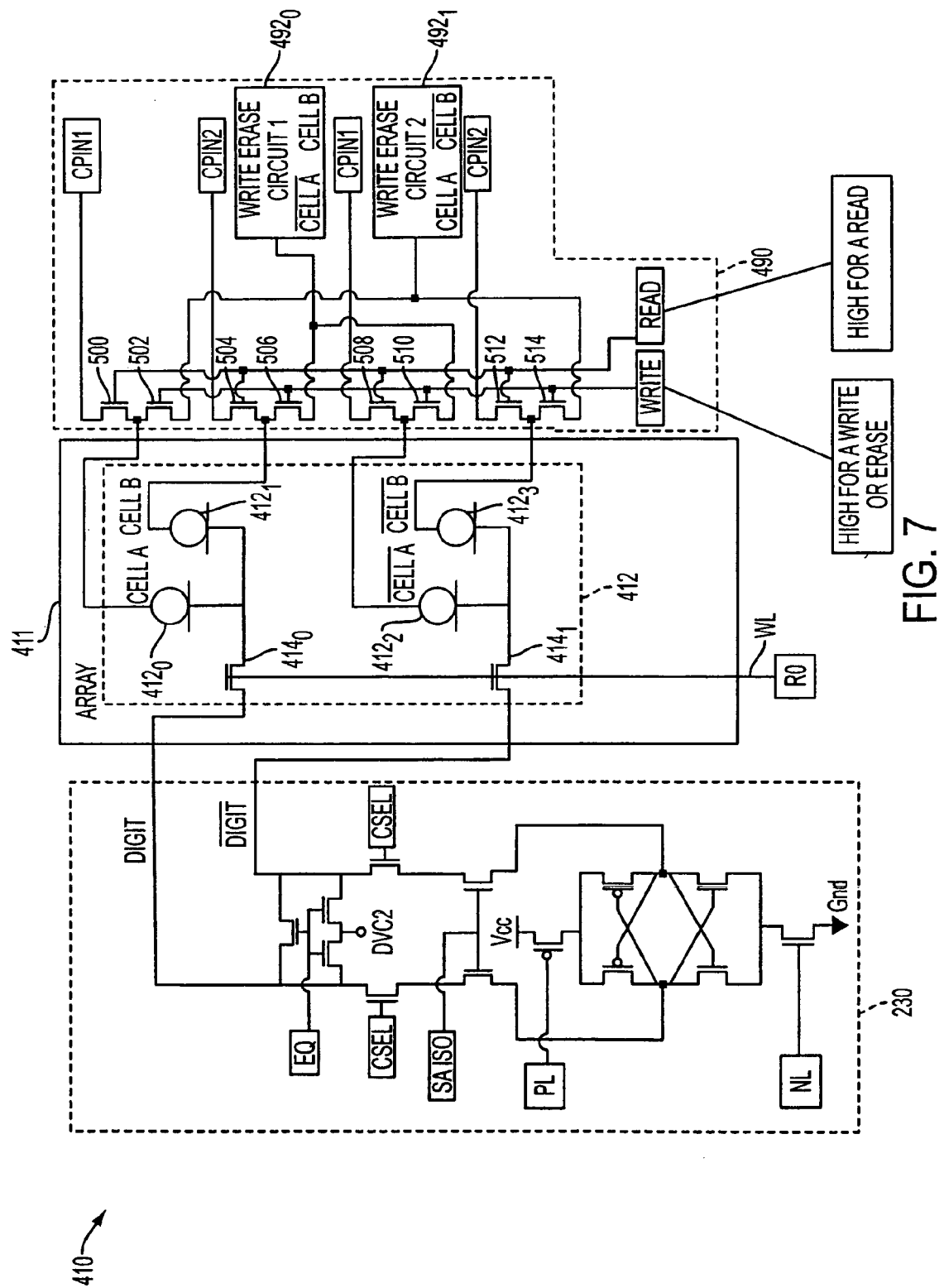
FIG. 7 illustrates a portion of a memory device, utilizing resistance variable memory elements as memory cells, constructed in accordance with another exemplary embodiment of the invention.

FIG. 7 illustrates a portion of a memory device 410, utilizing resistance variable memory elements as memory cells $412_0$, $412_1$, $412_2$, $412_3$ in a memory array 411, constructed in accordance with another exemplary embodiment of the invention. For exemplary purposes, PCRAM elements are used as the cells $412_0$, $412_1$, $412_2$, $412_3$. In the illustrated embodiment, the first two memory cells $412_0$, $412_1$ are connected to the first digit line DIGIT via access transistor $414_0$ and contain different phase change material. The third and fourth memory cells $412_2$, $412_3$ are connected to the second line $\overline{\text{DIGIT}}$ by access transistor $414_1$ and contain different phase change material. The memory cells $412_0$, $412_1$, $412_2$, $412_3$ and access transistors $414_0$, $414_1$ make up one large 2T PCRAM cell 412.

The gates of the access transistors $414_0$, $414_1$, are connected to the same word line WL such that they receive row select signal R0 at the same time. The digit lines DIGIT, $\overline{\text{DIGIT}}$ are connected to sensing circuitry 230, which is the same sensing circuitry described above with reference to FIG. 4.

The device 410 also includes write/erase circuitry 490 connected to the cell plates of the memory cells $412_0$, $412_1$, $412_2$, $412_3$. The write/erase circuitry 490 includes two write/erase circuits $492_0$, $492_1$ and eight transistors 500, 502, 504, 506, 508, 510, 512, 514.

The first transistor 500 is connected between the second transistor 502 and the first cell plate potential CPIN1. The second transistor 502 is connected between the first transistor 500 and the second write/erase circuit $492_1$. The cell plate of the first memory cell $412_0$ is connected to the connection between the first and second transistors 500, 502. The third transistor 504 is connected between the fourth transistor 506 and the second cell plate potential CPIN2. The fourth transistor 506 is connected between the third transistor 504 and the first write/erase circuit $492_0$. The cell plate of the second memory cell $412_1$ is connected to the connection between the third and fourth transistors 504, 506.

The fifth transistor 508 is connected between the sixth transistor 510 and CPIN1. The sixth transistor 510 is connected between the fifth transistor 508 and the second write/erase circuit $492_1$. The cell plate of the third memory cell $412_2$ is connected to the connection between the fifth and sixth transistors 508, 510. The seventh transistor 512 is connected between the eighth transistor 514 and CPIN2. The eighth transistor 514 is connected between the seventh transistor 512 and the first write/erase circuit $492_0$. The cell plate of the fourth memory cell $412_3$ is connected to the connection between the seventh and eighth transistors 504, 506. The gates of the first, third, fifth and seventh transistors 500, 504, 508, 512 are connected to a read signal READ. The gates of the second, fourth, sixth and eighth transistors 502, 506, 510, 514 are connected to a write signal WRITE.

Generally, the cell plate potentials CPIN1, CPIN2 are used to read and the write/erase circuits $492_0$, $492_1$ are used to write or erase the memory cells $412_0$, $412_1$, $412_2$, $412_3$. A write signal WRITE causes the cell plates to program the phase change resistance of the cells connected to the digit line DIGIT to one of the two voltages defined by the first write/erase circuit $492_0$ ("Write Erase CIRCUIT1"), for this example, DVC2+2V. The cell on the complementary digit line $\overline{\text{DIGIT}}$ is programmed to the opposite voltage defined by the second write/erase circuit $492_1$ ("Write Erase CIRCUIT2"), for this example, DVC2−2V. All other non-accessed digit lines on the same word line are not programmed since their top cell plate and digital lines are at the same potential (i.e., DVC2).

Generally, during a read operation, the first cell plate voltage CPIN1 is set to DVC2+200 mV while the second cell plate voltage CPIN2 is set to DVC2−200 mV. When the read signal READ is toggled high, the resistors within the memory cells $412_0$, $412_1$, $412_2$, $412_3$ are tied to their respective cell plate potentials. The programmed resistors (e.g., memory cells $412_0$, $412_1$) pull the digit line DIGIT up to CPIN1 or down to CPIN2 depending upon which cell was programmed. The cells (e.g., memory cells $412_2$, $412_3$) on the complementary digit line $\overline{\text{DIGIT}}$ pull the complementary digit line $\overline{\text{DIGIT}}$ in the opposite direction. This opens up the sensing window to approximately 380 mV at time t=150 nS as shown in FIG. 3.

Figure 8A:
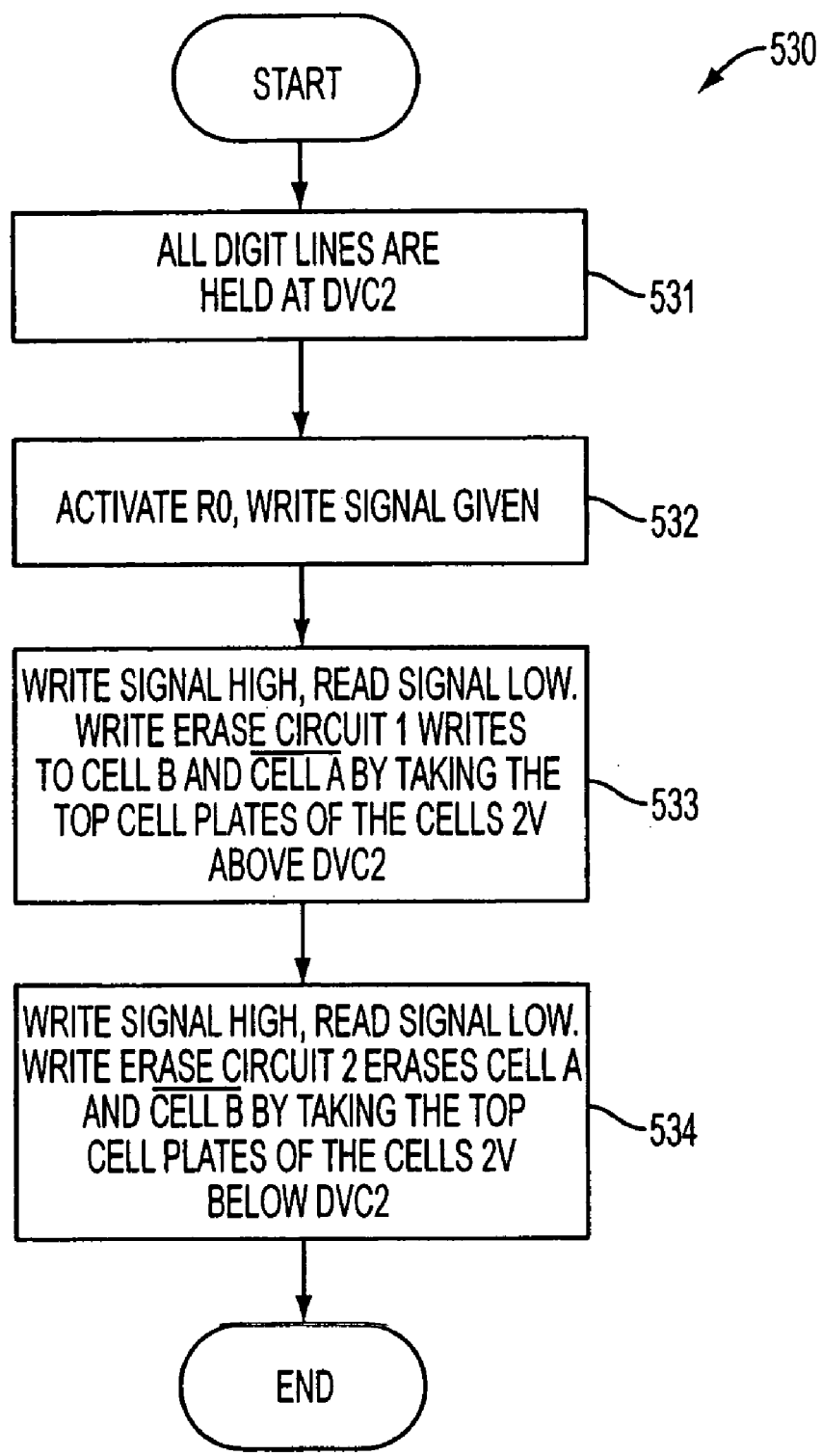
FIGS. 8A, 8B and 8C are flowcharts illustrating exemplary methods of operating the device illustrated in FIG. 7.

Referring to FIGS. 7 and 8A, an exemplary method 530 of operating the memory device 410 is now described. In the illustrated method 530, cell $412_0$ (Cell A) and cell $412_3$ ($\overline{\text{CellB}}$) are written to a high state. Initially, the digit lines DIGIT, $\overline{\text{DIGIT}}$ are held at DVC2 (step 531). The access transistors $414_0$, $414_1$ are activated by applying the row select signal R0 (step 532). The top cell plate for (Cell A) and ($\overline{\text{CellB}}$) are set to DVC2+2V through Write Erase Circuit 2 once the WRITE signal is given. This will write cell $412_0$ (Cell A) and cell $412_3$ ($\overline{\text{CellB}}$) at step 533. The top cell plate for (Cell B) and ($\overline{\text{CellA}}$) are set to DVC2−2V through Write Erase Circuit 1 once the WRITE signal is given. This will erase cell $412_1$ (Cell B) and cell $412_2$ ($\overline{\text{CellA}}$) at step 534. This places the cell 412 in a high resistance state.

Figure 8B:
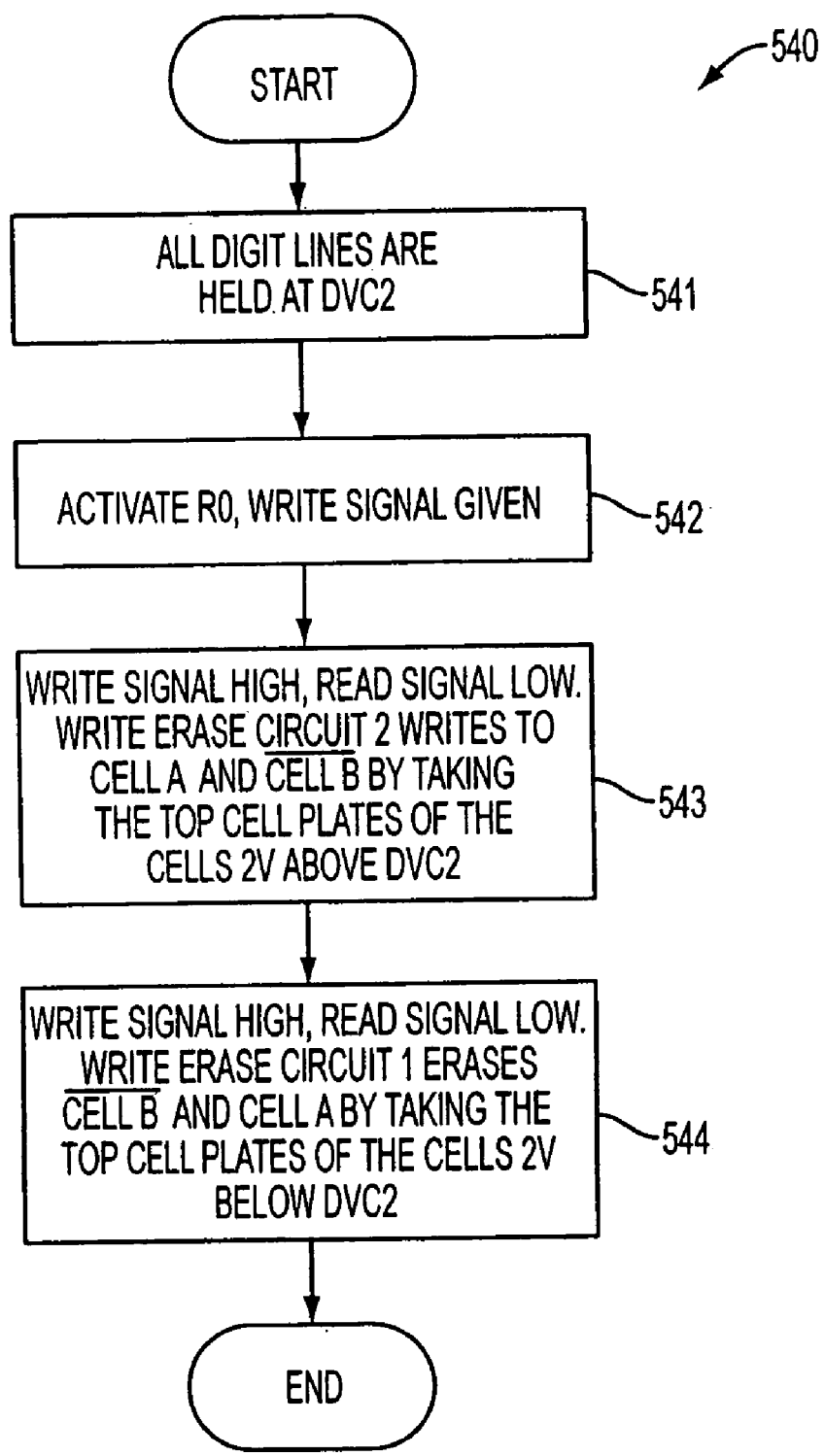

Referring to FIGS. 7 and 8B, another exemplary method 540 of operating the memory device 410 is now described. In the illustrated method 540, cell $412_1$ (Cell B) and cell $412_2$ ($\overline{\text{CellA}}$) are written to a high state. Initially, the digit lines DIGIT, $\overline{\text{DIGIT}}$ are held at DVC2 (step 541). The access transistors $414_0$, $414_1$ are activated by applying the row select signal R0 (step 542). The first complementary top cell plates potentials are set to DCV2+2V by the Write Erase CIRCUIT 1 once the WRITE signal is given, to write cell $412_1$ (Cell B) and cell $412_2$ ($\overline{\text{CellA}}$) at step 543. The first top cell plate potentials are set to DCV2−2V by the Write Erase CIRCUIT 2 once the WRITE signal is given, to erase cell $412_0$ (Cell A) and cell $412_3$ ($\overline{\text{CellB}}$) at step 544. This places the cell 412 in a low resistance state.

Figure 8C:
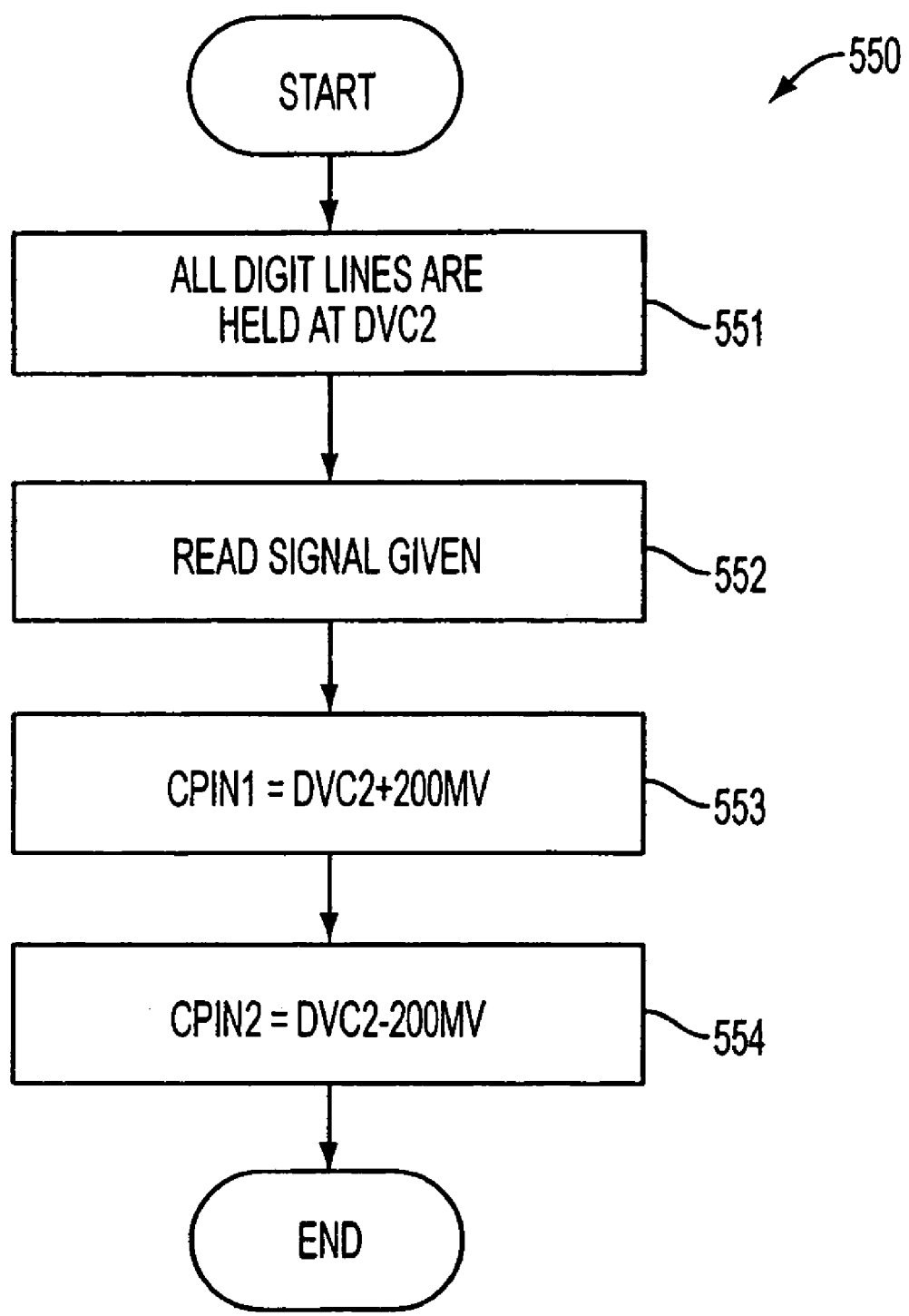

Referring to FIGS. 7 and 8C, an exemplary method 550 of operating the memory device 410 is now described for a read operation. Initially, the digit lines DIGIT, $\overline{\text{DIGIT}}$ are held at DVC2 (step 551). The first cell plate potential CPIN1 and the complementary first cell plate potential CPIN1 are set to DVC2+200 mV at step 552. The second cell plate potential CPIN2 and the second complementary cell plate potential CPIN2 are set to DVC2−2V at step 553. The cell 412 can now be sensed. As noted above, there will be a much larger sensing window as compared to the memory device 10 illustrated in FIGS. 1 and 2.

Figure 9:
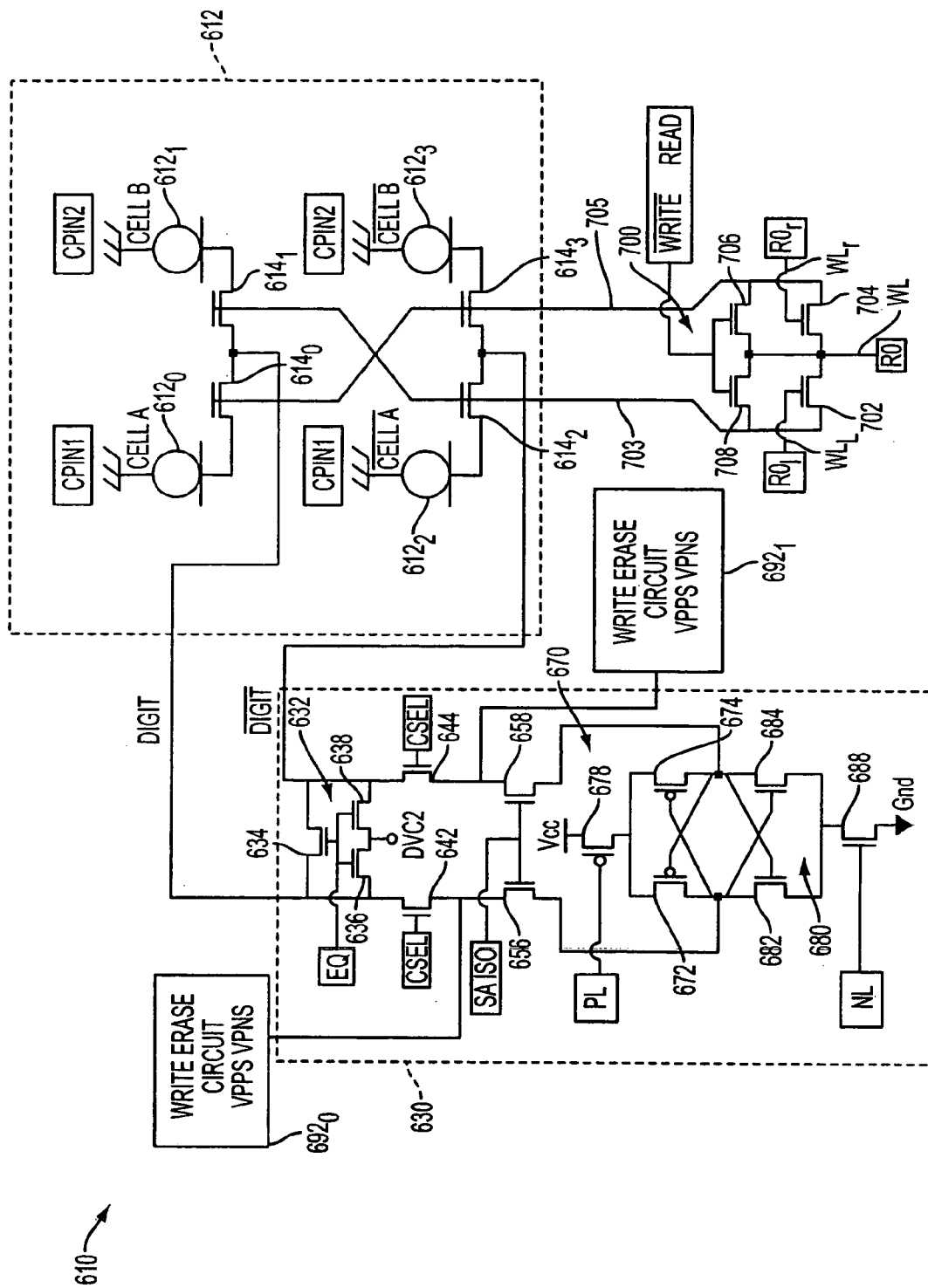
FIG. 9 illustrates a portion of a memory device, utilizing resistance variable memory elements as memory cells, constructed in accordance with yet another exemplary embodiment of the invention.

FIG. 9 illustrates a portion of a memory device 610, utilizing resistance variable memory elements as memory cells $612_0$, $612_1$, $612_2$, $612_3$, constructed in accordance with another exemplary embodiment of the invention. For exemplary purposes, PCRAM elements are used as the cells $612_0$, $612_1$, $612_2$, $612_3$. In the illustrated embodiment, the first two memory cells $612_0$, $612_1$ are connected to the first digit line DIGIT via access transistors $614_0$, $614_1$. The other two memory cells $612_2$, $612_3$ are connected to the complementary digit line $\overline{\text{DIGIT}}$ via access transistors $614_2$, $614_3$. The first and third memory cells $612_0$, $612_2$ have their cell plates connected to a first cell plate potential CPIN1. The second and fourth memory cells $612_1$, $612_3$ have their cell plates connected to a second cell plate potential CPIN2.

The memory cells $612_0$, $612_1$, $612_2$, $612_3$ and access transistors $614_0$, $614_1$, $614_2$, $614_3$ make up one large 4T PCRAM cell 612 with a double word line $WL_r$, $WL_l$. The first access transistor $614_0$ is also connected to the first digit line DIGIT and one terminal of the second access transistor $614_1$. The second access transistor $614_1$ is also connected to the first digit line DIGIT and the first access transistor $614_0$. The third access transistor $614_2$ is connected to the fourth access transistor $614_3$ and the complementary digit line $\overline{\text{DIGIT}}$. The gates of the first and fourth access transistors $614_0$, $614_3$ are connected to receive a right row select signal $R0_r$ from the right word line $WL_r$ via the write/read circuit 700. The gates of the second and third access transistors $614_1$, $614_2$ are connected to receive a left row select signal $R0_l$ from the left word line $WL_l$ via the write/read circuit 700.

The write/read circuit 700 includes four write/read transistors 702, 704, 706, 708. The first write/read transistor 702 is connected between the second write/read transistor 704 and a line 703 connected to the gates of the second and third access transistors $614_1$, $614_2$. The fourth write/read transistor 708 is connected between the third write/read transistor 706 and line 703. The second write/read transistor 704 is connected between the first write/read transistor 702 and a line 705 connected to the gates of the first and fourth access transistors $614_0$, $614_3$. The third write/read transistor 706 is connected between the fourth write/read transistor 708 and line 705. The gates of the first and second write/read transistors 702, 704 are connected to receive a row select signal R0 from a word line WL. The gates of the third and fourth write/read transistors 706, 708 are connected to the write/read control signal $\overline{\text{WRITEREAD}}$.

The digit lines DIGIT, $\overline{\text{DIGIT}}$ are connected to sensing circuitry 630. The sensing circuitry 630 includes an equilibration circuit 632, two column select transistors 642, 644, two isolating transistors 656, 658, a p-sense amplifier driver 678, a p-sense amplifier circuit 670, an n-sense amplifier driver 688 and an n-sense amplifier circuit 680.

The equilibration (EQ) circuit 632 includes three EQ transistors 634, 636, 638. The first EQ transistor 634 is connected between the two digit lines DIGIT, $\overline{\text{DIGIT}}$. The second EQ transistor 636 is connected between the first digit line DIGIT and the third EQ transistor 638. The third EQ transistor 638 is connected between the second digit line $\overline{\text{DIGIT}}$ and the second EQ transistor 636. The gate terminals of the three EQ transistors 634, 636, 638 are connected to an equilibration gating line EQ. A bias voltage DVC2 is applied at the connection of the second and third EQ transistors 636, 638. All three of the EQ transistors 634, 636, 638 are NMOS transistors. The equilibration circuit 632, in response to the equilibration gating signal EQ, effectively equalizes the charges held by the digit lines DIGIT, $\overline{\text{DIGIT}}$ after a read/write operation is completed and when the memory array is not active.

The first column select transistor 642 has its source and drain terminals connected between the first digit line DIGIT. The second column select transistor 644 has its source and drain terminals connected between the second digit line $\overline{\text{DIGIT}}$. The gates of the column select transistors 642, 644 are connected to respective column select lines to receive a column select signal CSEL. The column select transistors 642, 644 are activated by the column select signal CSEL when it is desired to connect the remaining circuitry 630 to the memory cells $612_0$, $612_1$, $612_2$, $612_3$.

The first isolating transistor 656 is connected between the first digit line DIGIT and a first connection between the p-sense amplifier circuit 670 and the n-sense amplifier circuit 680. The second isolating transistor 658 is connected between the second digit line $\overline{\text{DIGIT}}$ and a second connection between the p-sense amplifier circuit 670 and the n-sense amplifier circuit 680. The gate terminals of the first and second isolating transistors 656, 658 are connected to an isolation gating signal SA ISO. The illustrated isolating transistors 656, 658 are NMOS transistors. The isolating transistors 656, 658, when activated by the isolation gating signal SA ISO, form isolation devices that effectively remove certain portions of the circuit 630 during addressing.

The p-sense amplifier circuit 670 includes two PMOS transistors 672, 674. The n-sense amplifier circuit 680 includes two NMOS transistors 682, 684. The first PMOS transistor 672 has its gate terminal connected to the second digit line $\overline{\text{DIGIT}}$ and is connected between the first NMOS transistor 682 and the p-sense amplifier driver 678. The second PMOS transistor 674 has its gate terminal connected to the first digit line DIGIT and is connected between the second NMOS transistor 684 and driver 678. The p-sense amplifier driver 678 drives the p-sense amplifier 670 when a p-sense amplifier latching signal PL is applied to the gate of the driver 678.

The first NMOS transistor 682 has its gate terminal connected to the second digit line $\overline{\text{DIGIT}}$ and is connected between the n-sense amplifier driver 688 and the first PMOS transistor 672. The second NMOS transistor 684 has its gate terminal connected to the first digit line DIGIT and is connected between driver 688 and the second PMOS transistor 674. The n-sense amplifier driver 688 drives the n-sense amplifier 680 when an n-sense amplifier latching signal NL is applied to the gate of the driver 688.

The device 610 also includes write/erase circuitry $692_0$, $692_1$ connected to sensing circuitry 630. The first write/erase circuit $692_0$ is connected to the first digit line DIGIT when the first column select transistor 642 is activated by the column select signal CSEL. The second write/erase circuit $692_1$ is connected to the complementary digit line $\overline{\text{DIGIT}}$ when the second column select transistor 644 is activated by the column select signal CSEL. The write/erase circuitry $692_0$, $692_1$ also performs operations during a read operation and is discussed below in more detail.

FIG. 10 illustrates a portion of the memory device 610 illustrated in FIG. 9. The FIG. 10 illustration does not include the sensing circuitry 630 or the write/erase circuits $692_0$, $692_1$ for clarity purposes.

Generally, to write or erase the cells $612_0$, $612_1$, $612_2$, $612_3$, the cell plates are held at DVC2 (via CPIN1 and CPIN2) and the write/read control signal $\overline{\text{WRITEREAD}}$ allows the left or right word lines $WL_l$, $WL_r$ to access complimentary cells, which are programmed with the VPPS or VPNS potentials that are applied to the digit lines DIGIT, $\overline{\text{DIGIT}}$. All other non-accessed memory cells $612_0$, $612_1$, $612_2$, $612_3$ associated with the accessed word line are not programmed since their top cell plate potential and their respective digit lines are held at DVC2. That is, the voltage across the non-addressed cells is approximately 0V.

During a read operation, the first cell plate potential CPIN1 is set to DVC2+200 mV and the second cell plate potential CPIN2 is set to DVC2−200 mV. The write/read control signal $\overline{\text{WRITEREAD}}$ is toggled high to turn on the left and right word lines $WL_l$, $WL_r$. The programmed cell can pull its digit line up to CPIN1 or down to CPIN2 depending upon which word line $WL_l$, $WL_r$ was used to program the cell. The complimentary digit line is pulled to the opposite cell plate potential. This opens up the sensing window to approximately 380 mV at time t=150 nS as shown in FIG. 3.

Figure 11A:
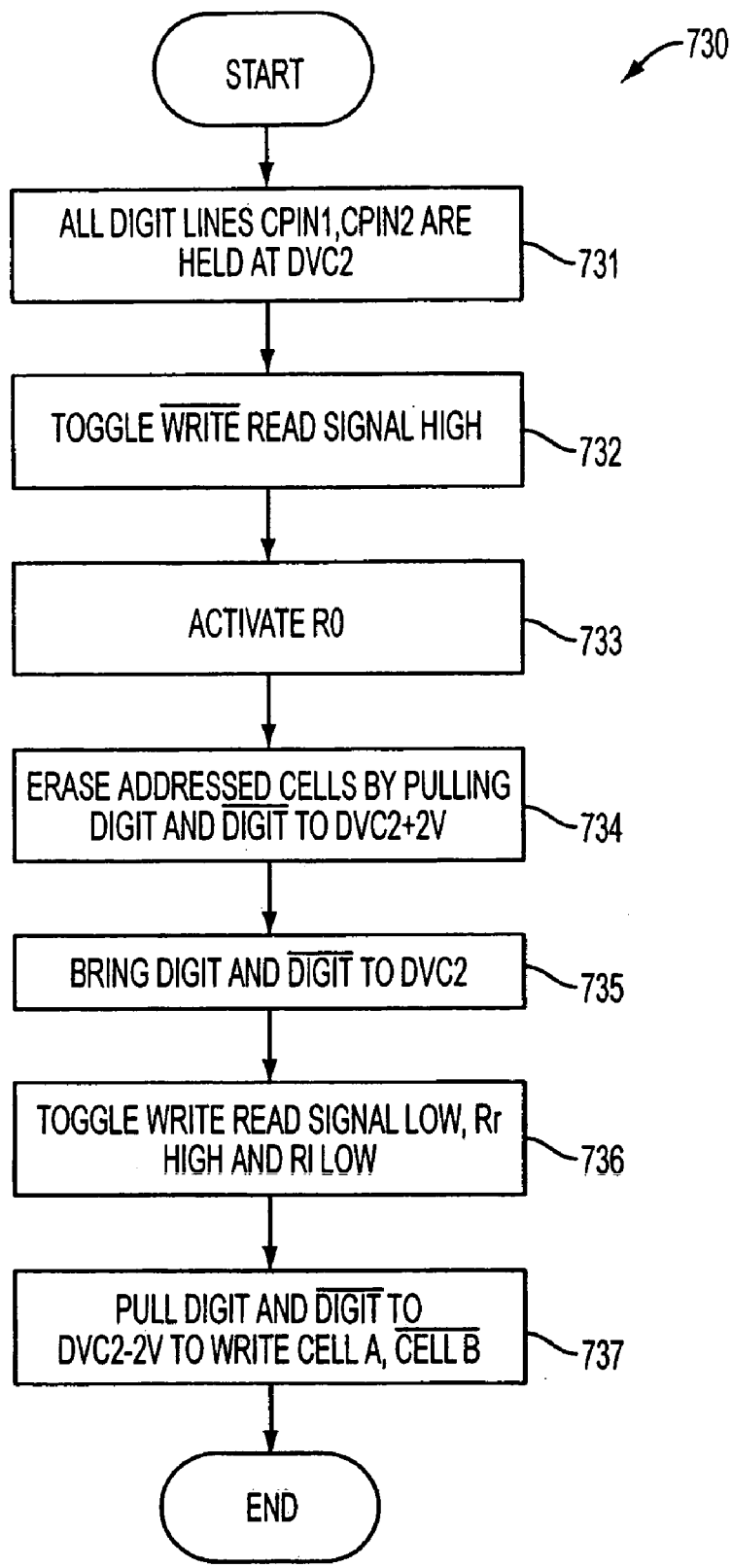
FIGS. 11A, 11B and 11C are flowcharts illustrating exemplary methods of operating the device illustrated in FIGS. 9 and 10.

Referring to FIGS. 10 and 11A, an exemplary method 730 of operating the memory device 610 is now described. In the illustrated method 730, cell $612_0$ (Cell A) and cell $612_3$ ($\overline{\text{CellB}}$) are written to a high state. Initially, the digit lines DIGIT, $\overline{\text{DIGIT}}$ and the cell plate potentials CPIN1, CPIN2 are held at DVC2 (step 731). The write/read control signal $\overline{\text{WRITEREAD}}$ is toggled high at step 732. The row select signal R0 is generate (step 733). The addressed cells are erased by pulling the digit lines DIGIT, $\overline{\text{DIGIT}}$ to DVC2+2V at step 734. The digit lines DIGIT, $\overline{\text{DIGIT}}$ are returned to DVC2 at step 735. The write/read control signal $\overline{\text{WRITEREAD}}$ is toggled low while the right word line $WL_r$ is toggled high and the left word line $WL_l$ is toggled low (step 736). The digit lines DIGIT, $\overline{\text{DIGIT}}$ are pulled to DVC2−2V to write cell $612_0$ (Cell A) and cell $612_3$ ($\overline{\text{CellB}}$) at step 737. This places the cell 612 in a high resistance state.

Figure 11B:
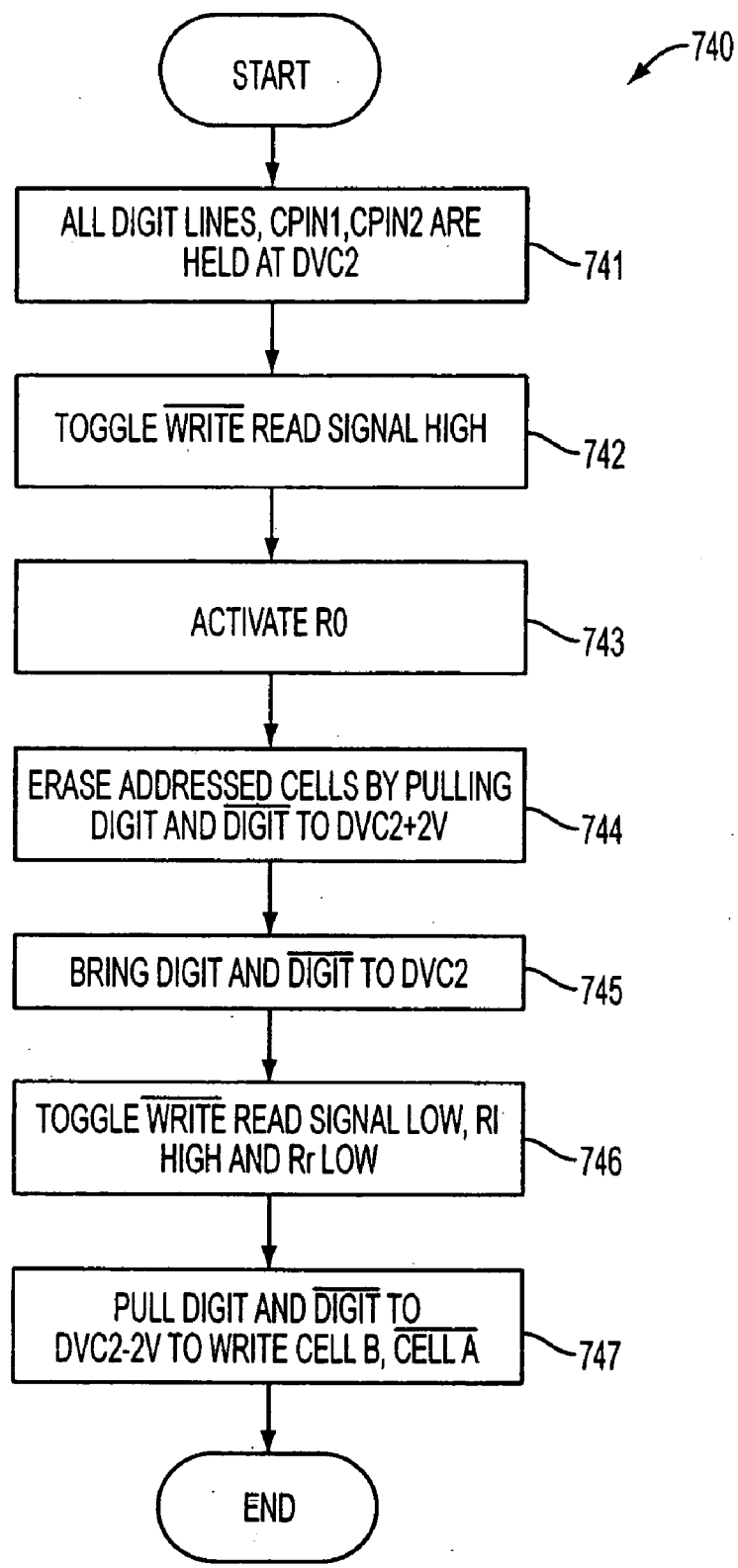

Referring to FIGS. 10 and 11B, an exemplary method 740 of operating the memory device 610 is now described. In the illustrated method 740, cell $612_1$ (Cell B) and cell $612_2$ ($\overline{\text{CellA}}$) are written to a high state. Initially, the digit lines DIGIT, $\overline{\text{DIGIT}}$ and the cell plate potentials CPIN1, CPIN2 are held at DVC2 (step 741). The write/read control signal $\overline{\text{WRITEREAD}}$ is toggled high at step 742. The row select signal R0 is generate (step 743). The addressed cells are erased by pulling the digit lines DIGIT, $\overline{\text{DIGIT}}$ to DVC2+2V at step 744. The digit lines DIGIT, $\overline{\text{DIGIT}}$ are returned to DVC2 at step 745. The write/read control signal $\overline{\text{WRITEREAD}}$ is toggled low while the right word line $WL_r$ is toggled low and the left word line $WL_l$ is toggled high (step 746). The digit lines DIGIT, $\overline{\text{DIGIT}}$ are pulled to DVC2−2V to write cell $612_1$ (Cell B) and cell $612_2$ ($\overline{\text{CellA}}$) are written to a high state at step 747. This places the cell 612 in a low resistance state.

Figure 11C:
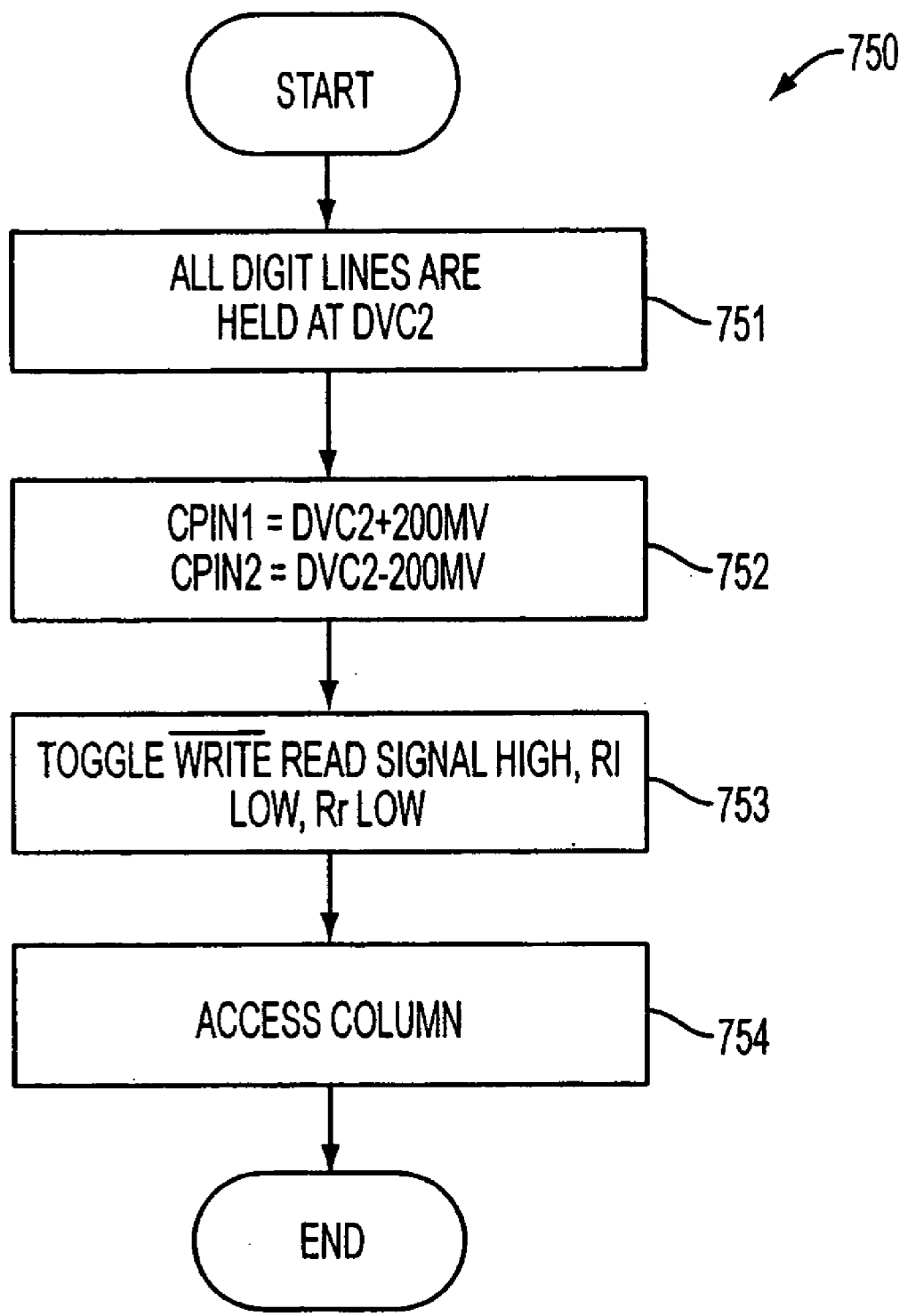

Referring to FIGS. 10 and 11C, an exemplary method 750 of operating the memory device 610 is now described for a read operation. Initially, the digit lines DIGIT, $\overline{\text{DIGIT}}$ are held at DVC2 (step 751). The first cell plate potential CPIN1 is set to DVC2+200 mV and the second cell plate potential CPIN2 is set to DVC2−2V at step 752. At step 753, the write/read control signal $\overline{\text{WRITEREAD}}$ is toggled high while the right and left word lines $WL_r$, $WL_l$ are toggled low. The column is then accessed and the sensing of the digit lines DIGIT, $\overline{\text{DIGIT}}$ occurs (step 754). As noted above, there will be a much larger sensing window as compared to the memory device 10 illustrated in FIGS. 1 and 2.

Figure 12:
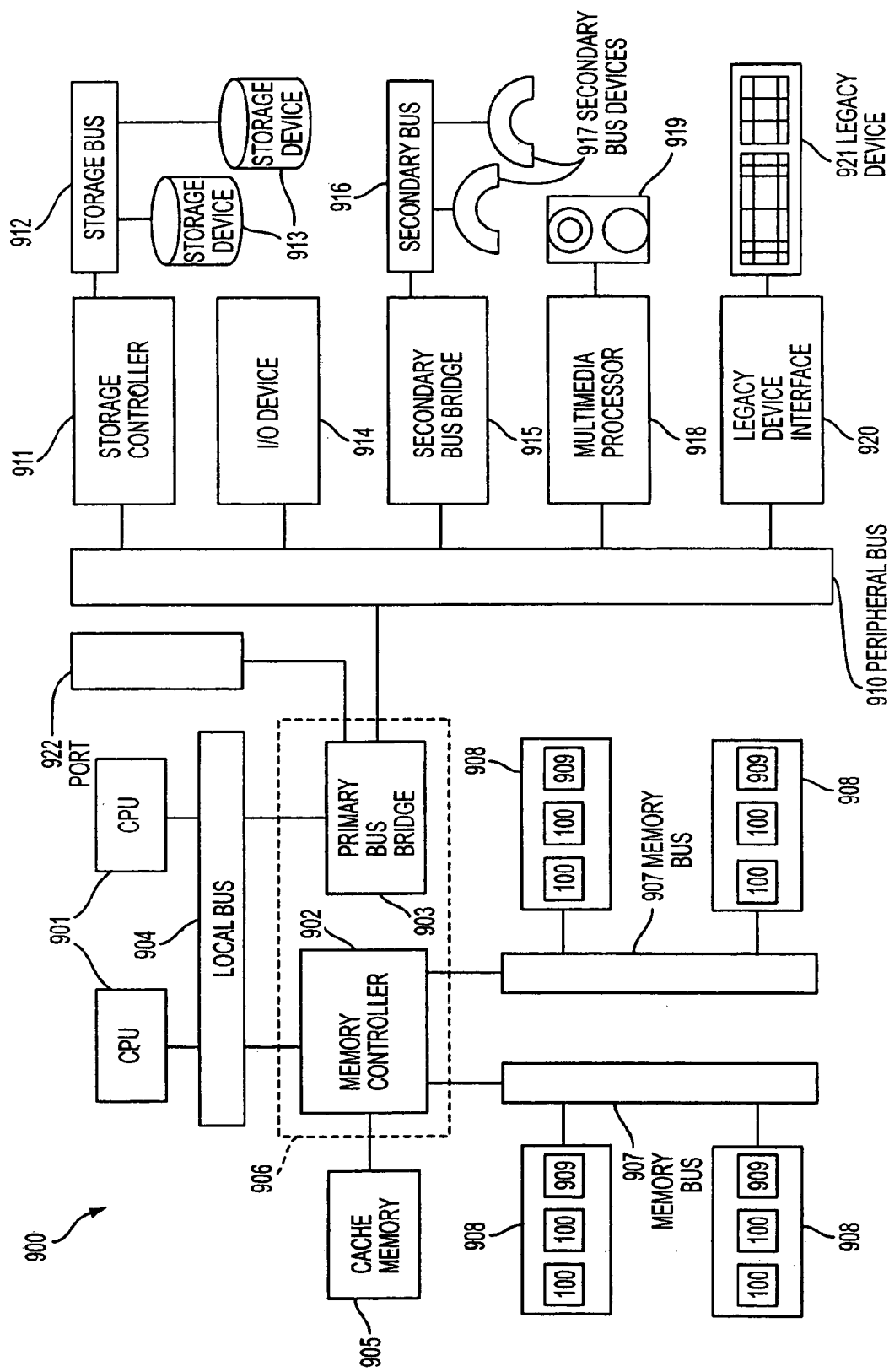
FIG. 12 shows a processor system incorporating at least one memory device constructed in accordance with an embodiment of the invention.

FIG. 12 shows a processor system 900 that may utilize a memory device 100 incorporating one of the embodiments of the invention (i.e., deice 210, 410, 610 of FIGS. 4, 7, 9), in accordance with the invention. The processing system 900 includes one or more processors 901 coupled to a local bus. 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus 907 accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge 915 may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices 921, for example, older styled keyboards and mice, to the processing system 900.

The processing system 900 illustrated in FIG. 12 is only an exemplary processing system that may use the memory devices of the invention. While FIG. 12 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

It should be appreciated that other embodiments of the invention include a method of manufacturing the devices 210, 410, 610 of the invention. For example, in one exemplary embodiment, a method of manufacturing a memory device includes the acts of providing an array of memory cells, each cell being connected to first and second digit lines, each cell comprising a plurality of resistance variable memory elements and a plurality of access; and providing sensing circuitry connected to the first and second digit lines, said sensing circuitry sensing the state of an addressed memory cell by changing a cell plate potential of the memory elements within the cell and sensing the difference between the first and second digit lines connected to the addressed cell.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A resistance variable memory device integrated circuit, comprising:
   an array of resistance variable memory cells, each resistance variable memory cell being connected to first and second digit lines, each resistance variable memory cell comprising at least four resistance variable memory elements and at least four access transistors, each access transistor being associated with and connected between a respective resistance variable memory element and a sub bit line;
   a first circuit connected between the first and second digit lines and the sub bit lines of at least one resistance variable memory cell, the first circuit adapted to write the at least one resistance variable memory cell to a first resistance state and erase the cell to a second resistance state; and
   sensing circuitry connected to the first and second digit lines, the sensing circuitry adapted to sense the state of an addressed memory cell by changing a cell plate potential of the memory elements within the cell and sensing the difference between the first and second digit lines connected to the addressed cell.

2. The integrated circuit of claim 1, wherein said first and second digit lines are complementary digit lines.

3. The integrated circuit of claim 1, wherein a first pair of the sub bit lines are complements of a second pair of the sub bit lines.

4. The integrated circuit of claim 1, wherein the first circuit is adapted to control the sub bit lines such that during read, write and erase operations one memory element is connected to the first digit line via a respective sub bit line and respective access transistor and another memory element is connected to the second digit line via a different respective sub bit line and a respective access transistor.

5. The integrated circuit of claim 4, wherein a control signal is used to switchingly connect the one memory element to the first digit line and the other memory element to the second digit line.

6. The integrated circuit of claim 4, wherein the first circuit applies a first programming voltage to write memory elements within a cell to the first resistance state and a second programming voltage to erase other memory elements within a cell to the second resistance state.

7. The integrated circuit of claim 1, wherein the access transistors within a cell are connected to a same word line.

8. The integrated circuit of claim 1, wherein the sensing circuit has a sensing window of at least 240 mV.

9. The integrated circuit of claim 1, wherein the sensing circuit has a sensing window of approximately 380 mV.

10. The integrated circuit of claim 1, wherein the sensing circuit can sense the cell at approximately 50 nS after the cell has been accessed for a read operation.

11. The integrated circuit of claim 1, wherein non-addressed memory cells are held at approximately 0V when addressed cells are undergoing a write operation.

12. A resistance variable memory device integrated circuit, comprising:
   an array of resistance variable memory cells, each resistance variable memory cell being connected to first and second digit lines, each resistance variable memory cell comprising at least four resistance variable memory elements and two access transistors, each access transistor being associated with and connected between two respective resistance variable memory elements and a respective one of the first and second digit lines;
   a first circuit connected to cell plates of said memory elements of at least one resistance variable memory cell, the first circuit adapted to write the at least one resistance variable memory cell to a first resistance state and erase the cell to a second resistance state; and
   sensing circuitry connected to the first and second digit lines, the sensing circuitry adapted to sense the state of an addressed memory cell by changing a cell plate potential of the memory elements within the cell and sensing the difference between the first and second digit lines connected to the addressed cell.

13. The integrated circuit of claim 12, wherein the access transistors are controllable by a same word line.

14. The integrated circuit of claim 12, wherein the first circuit applies respective cell plate voltages to each memory element in an addressed cell during read operations.

15. The integrated circuit of claim 12, wherein the first circuit is adapted to apply a first programming voltage to write memory elements within the at least one resistance variable memory cell to the first resistance state and a second programming voltage to erase other memory elements within the cell to the second resistance state.

16. The integrated circuit of claim 15, wherein the first circuit connects one memory element to the first digit line and another element to the second digit line in response to a first control signal.

17. The integrated circuit of claim 12, wherein the sensing circuit has a sensing window of at least 240 mV.

18. The integrated circuit of claim 12, wherein the sensing circuit has a sensing window of approximately 380 mV.

19. The integrated circuit of claim 12, wherein non-addressed memory cells are held at approximately 0V when addressed cells are undergoing a write operation.

20. A resistance variable memory device integrated circuit, comprising:

an array of resistance variable memory cells, each resistance variable memory cell being connected to first and second digit lines, each resistance variable memory cell comprises four memory elements and four access transistors associated with a respective memory element, a first pair of said access transistors having a terminal connected to the first digit line, a second pair of the access transistors having a terminal connected to the second digit line, one access transistor from each pair being connected to a first sub word line and another access transistor from each pair being connected to a second sub word line;

a first circuit connected to gate terminals of said access transistors within at least one resistance variable memory cell to connect one memory element to the first digit line and another memory element to the second digit line during read, write and erase operations; and sensing circuitry connected to the first and second digit lines, the sensing circuitry adapted to sense the state of an addressed resistance variable memory cell by changing a cell plate potential of the memory elements within the cell and sensing the difference between the first and second digit lines connected to the addressed cell.

21. The integrated circuit of claim 20, wherein said first circuit is adapted to apply a first cell plate voltages to said one memory element and a second cell plate voltage to said another memory element during read operations.

22. The integrated circuit of claim 21, wherein a second circuit is adapted to apply a first programming voltage to write memory elements within the cell to the first resistance state and a second programming voltage to erase other memory elements within the cell to the second resistance state.

23. The integrated circuit of claim 20, wherein the sensing circuit has a sensing window of at least 240 mV.

24. The integrated circuit of claim 20, wherein the sensing circuit has a sensing window of approximately 380 mV.

25. The integrated circuit of claim 20, wherein the sensing circuit can sense the cell at approximately 50 nS after the cell has been accessed for a read operation.

26. The integrated circuit of claim 20, wherein non-addressed memory cells are held at approximately 0V when addressed cells are undergoing a write operation.

* * * * *

UNITED STATES PATENT AND TRADEMARK OFFICE
CERTIFICATE OF CORRECTION

| | |
|---|---|
| PATENT NO. | : 7,190,608 B2 |
| APPLICATION NO. | : 11/473308 |
| DATED | : March 13, 2007 |
| INVENTOR(S) | : Ethan Williford et al. |

It is certified that error appears in the above-identified patent and that said Letters Patent is hereby corrected as shown below:

Item (56) In the Other Publications portion of the References Cited section, the following errors are corrected:

"Bemede, J.C.; Khelil, A.; Ketlaf, M.; Conan, A., Transition from S- to N-type differential negative resistance in $Al-Al_2O_3-Ag_{2-x}Se_{1+x}$ thin film structures, Phys. Stat. Sol. (a) 74 (1982) 217-224."

Should read

--Bernede, J.C.; Khelil, A.; Kettaf, M.; Conan, A., Transition from S- to N-type differential negative resistance in $Al-Al_2O_3-Ag_{2-x}Se_{1+x}$ thin film structures, Phys. Stat. Sol. (a) 74 (1982) 217-224.--;

"Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989)"

Should read

--Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.--;

"Hajto, J.; Owen, A.E.; Snell, A.J.; Le Comber, P.G.; Rose, M.J., Analogue memory and ballitic electron in metal-amorphous silicon structures, Phil. Mag. B 63 (1991) 349-369."

Should read

--Hajto, J.; Owen, A.E.; Snell, A.J.; Le Comber, P.G.; Rose, M.J., Analogue memory and ballistic electron in metal-amorphous silicon structures, Phil. Mag. B 63 (1991) 349-369."--;

UNITED STATES PATENT AND TRADEMARK OFFICE
CERTIFICATE OF CORRECTION

| | |
|---|---|
| PATENT NO. | : 7,190,608 B2 |
| APPLICATION NO. | : 11/473308 |
| DATED | : March 13, 2007 |
| INVENTOR(S) | : Ethan Williford et al. |

It is certified that error appears in the above-identified patent and that said Letters Patent is hereby corrected as shown below:

Item (56) In the Other Publications portion of the References Cited section, the following errors are corrected: (cont'd)

"Korkinova, Ts.N.; Andreichin, R.E., Chalcogenide glass polarization and the type of contacts, J. Non-Cryst. Solids 1994 (1996) 256-259."

Should read

--Korkinova, Ts.N.; Andreichin, R.E., Chalcogenide glass polarization and the type of contacts, J. Non-Cryst. Solids 194 (1996) 256-259.--;

"Mitova, M.; Boolchand, P., Microscopic origin of the glass forming tendency in chalcogenides and constraint theory, J. Non-Cryst. Solids 240 (1998) 1-21."

Should read

--Mitkova, M.; Boolchand, P., Microscopic origin of the glass forming tendency in chalcogenides and constraint theory, J. Non-Cryst. Solids 240 (1998) 1-21.--;

"Mitkova, M.; Kozlcki, M.N., Silver incorporation in Ge-Se glasses used in programmable metallization cell devices, J. Non-Cryst. Solids 299-302 (2002) 1023-1027."

Should read

--Mitkova, M.; Kozicki, M.N., Silver incorporation in Ge-Se glasses used in programmable metallization cell devices, J. Non-Cryst. Solids 299-302 (2002)1023-1027.--;

"Ovshinsky, S.R., Reversible electrical switching phenomena in disordered structures, Phys."

Should read

--Ovshinsky, S.R., Reversible electrical switching phenomena in disordered structures, Phys. Rev. Lett. 21 (1968) 1450-1453.--;

UNITED STATES PATENT AND TRADEMARK OFFICE
CERTIFICATE OF CORRECTION

| | | |
|---|---|---|
| PATENT NO. | : 7,190,608 B2 | |
| APPLICATION NO. | : 11/473308 | |
| DATED | : March 13, 2007 | |
| INVENTOR(S) | : Ethan Williford et al. | |

It is certified that error appears in the above-identified patent and that said Letters Patent is hereby corrected as shown below:

Item (56) In the Other Publications portion of the References Cited section, the following errors are corrected: (cont'd)

"Kotkata, M.F.; Afif, M.A.; Labib, H.H.; Hegab, N.A.; Abdel-Aziz, M.M., Memory switching in amorphous GeTeTI chalcogenide semiconductor films, Thin Solid Films 240 (1994) 143-146."

Should read

--Kotkata, M.F.; Afifi, M.A.; Labib, H.H.; Hegab, N.A.; Abdel-Aziz, M.M., Memory switching in amorphous GeTeTI chalcogenide semiconductor films, Thin Solid Films 240 (1994) 143-146.--; and Item (56) In the Other Publications portion of the References Cited section, the following errors are corrected: (cont'd)

"McHardy et al., The dissolution of metals in amorphous chacogenides and th effects o electron and ultraviolet radiation, 20 J. Phys. C., Solid State Phys.., pp. 4055-4075 (1987)f."

Should read

-- McHardy et al., The dissolution of metals in amorphous chacogenides and the effects of electron and ultraviolet radiation, 20 J. Phys. C., Solid State Phys.., pp. 4055-4075 (1987).--.

In the Specification, the following errors are corrected:

Column 8, line 21, "ate" should read --are--.

Column 12, line 61, "complimentary" should read --complementary--;

Column 13, line 8, "complimentary" should read --complementary--;

Column 13, line 19, "generate" should read --generated--;

Column 13, line 35, "generate" should read --generated--;

Column 13, line 59, "deice" should read --device--;

Column 13, line 63, "coupled the" should read --coupled to the--;

UNITED STATES PATENT AND TRADEMARK OFFICE
CERTIFICATE OF CORRECTION

PATENT NO. : 7,190,608 B2
APPLICATION NO. : 11/473308
DATED : March 13, 2007
INVENTOR(S) : Ethan Williford et al.

It is certified that error appears in the above-identified patent and that said Letters Patent is hereby corrected as shown below:

In the Specification, the following errors are corrected: (cont'd)

Column 14, line 31, "also coupled" should read --also be coupled--;

Column 14, line 45, "an universal" should read --a universal--;

Column 14, line 46, "via to the" should read --via the--;

Column 14, line 49, "to one additional" should read --to additional--; and

Column 14, line 67, "system" should read --systems--.

In the Claim 21, the following error is corrected:

Column 18, line 2, "voltages" should read --voltage--.

Signed and Sealed this

Twenty-ninth Day of May, 2007

JON W. DUDAS
*Director of the United States Patent and Trademark Office*